United States Patent
Kim et al.

(10) Patent No.: US 11,581,188 B2
(45) Date of Patent: Feb. 14, 2023

(54) SUBSTRATE BONDING APPARATUS

(71) Applicant: Samsung Electronics Co., Ltd., Suwon-si (KR)

(72) Inventors: Junhyung Kim, Yongin-si (KR); Kyeongbin Lim, Seoul (KR); Minsoo Han, Hwaseong-si (KR); Minwoo Rhee, Seoul (KR); Inbae Chang, Chuncheon-si (KR)

(73) Assignees: SAMSUNG ELECTRONICS CO., LTD., Suwon-si (KR); KNU-Industry Cooperation Foundation, Chuncheon-si (KR)

( * ) Notice: Subject to any disclaimer, the term of this patent is extended or adjusted under 35 U.S.C. 154(b) by 449 days.

(21) Appl. No.: 16/842,083

(22) Filed: Apr. 7, 2020

(65) Prior Publication Data

US 2021/0104405 A1    Apr. 8, 2021

(30) Foreign Application Priority Data

Oct. 2, 2019    (KR) .................... 10-2019-0122155

(51) Int. Cl.
*H01L 21/18*    (2006.01)
*B32B 37/00*    (2006.01)
(Continued)

(52) U.S. Cl.
CPC ............ *H01L 21/187* (2013.01); *B23K 20/10* (2013.01); *B32B 37/0046* (2013.01); *B32B 37/10* (2013.01); *B32B 38/18* (2013.01); *B32B 38/1825* (2013.01); *B32B 41/00* (2013.01); *H01L 21/2007* (2013.01);
(Continued)

(58) Field of Classification Search
CPC .............. H01L 21/187; H01L 21/2007; H01L 21/67092; H01L 21/67259; H01L 21/6838; H01L 21/68742; H01L 21/6875; H05K 13/082; B23K 20/10; B32B 37/0046; B32B 37/10; B32B 38/18; B32B 38/1825; B32B 41/00; B32B 2309/10; B32B 2309/72; B32B 2310/028; B32B 2457/14

See application file for complete search history.

(56) References Cited

U.S. PATENT DOCUMENTS 9,711,483 B2    7/2017    Wada
10,438,920 B2    10/2019    Otsuka et al.
(Continued)

FOREIGN PATENT DOCUMENTS

JP    2007301600 A    11/2007
JP    2010528460 A    8/2010
(Continued)

*Primary Examiner* — Vishal I Patel
(74) *Attorney, Agent, or Firm* — Muir Patent Law, PLLC

(57) ABSTRACT

A substrate bonding apparatus for bonding a first substrate to a second substrate includes a first bonding chuck supporting the first substrate, a second bonding chuck disposed above the first bonding chuck and supporting the second substrate, a resonant frequency detector detecting a resonant frequency of a bonded structure with the first substrate and the second substrate which are at least partially bonded to each other, and a controller controlling a distance between the first bonding chuck and the second bonding chuck according to the detected resonant frequency of the bonded structure.

20 Claims, 26 Drawing Sheets

(51) Int. Cl.
    *B23K 20/10*       (2006.01)
    *H01L 21/20*       (2006.01)
    *H01L 21/683*      (2006.01)
    *H01L 21/687*      (2006.01)
    *H01L 21/67*       (2006.01)
    *H05K 13/08*       (2006.01)
    *B32B 41/00*       (2006.01)
    *B32B 37/10*       (2006.01)
    *B32B 38/18*       (2006.01)

(52) U.S. Cl.
    CPC .. *H01L 21/67092* (2013.01); *H01L 21/67259* (2013.01); *H01L 21/6838* (2013.01); *H01L 21/6875* (2013.01); *H01L 21/68742* (2013.01); *H05K 13/082* (2018.08); *B32B 2309/10* (2013.01); *B32B 2309/72* (2013.01); *B32B 2310/028* (2013.01); *B32B 2457/14* (2013.01)

(56) References Cited

U.S. PATENT DOCUMENTS

| | | | |
|---|---|---|---|
| 2015/0357226 A1* | 12/2015 | Liu | B23B 31/305 |
| | | | 438/457 |
| 2019/0019677 A1* | 1/2019 | Kurz | H01L 25/50 |
| 2020/0013643 A1 | 1/2020 | Kim et al. | |
| 2020/0055296 A1 | 2/2020 | Kim et al. | |

FOREIGN PATENT DOCUMENTS

| | | |
|---|---|---|
| JP | 5354382 B2 | 11/2013 |
| JP | 5540605 B2 | 7/2014 |
| JP | 6083041 B2 | 2/2017 |
| JP | 2018093018 A | 6/2018 |
| JP | 6448848 B2 | 1/2019 |
| JP | 2019050295 A | 3/2019 |
| KR | 10-2020-0005333 A | 1/2020 |
| KR | 10-2020-0025540 A | 3/2020 |

* cited by examiner

FIG. 3E
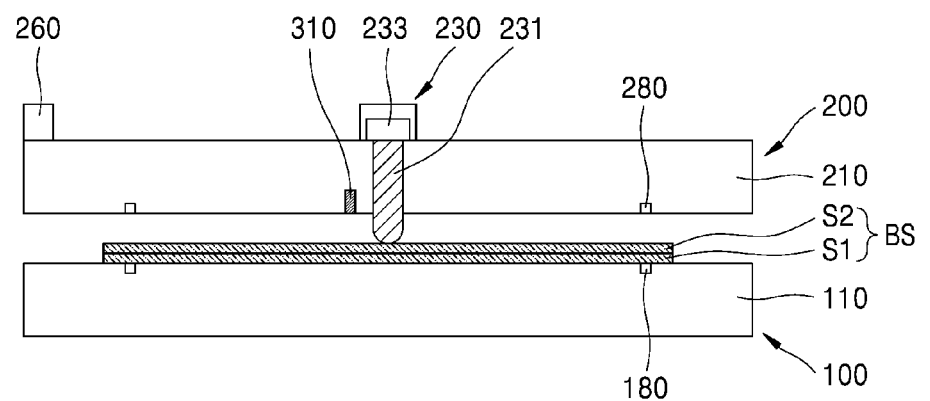
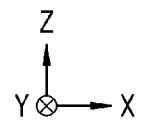

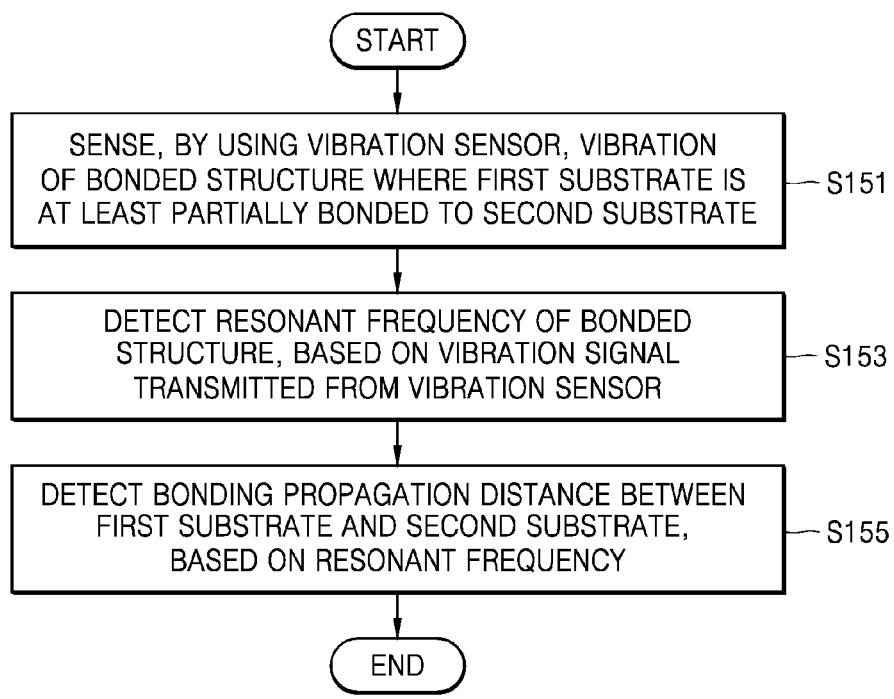

SUBSTRATE BONDING APPARATUS

CROSS-REFERENCE TO RELATED APPLICATION

This application claims priority under 35 U.S.C. § 119 to Korean Patent Application No. 10-2019-0122155, filed on Oct. 2, 2019, in the Korean Intellectual Property Office, the disclosure of which is incorporated by reference herein in its entirety.

BACKGROUND

The inventive concept relates to a substrate bonding apparatus, and method of manufacturing a semiconductor device using the substrate bonding apparatus.

In a process of manufacturing semiconductor devices, a substrate bonding process of bonding two or more substrates may be performed. The substrate bonding process may be performed for increasing a mounting density of semiconductor chips in a semiconductor device. For example, semiconductor devices having a structure where semiconductor chips are stacked may increase a mounting density of semiconductor chips and decrease a wiring length between the semiconductor chips, thereby performing high-speed signal processing. When a semiconductor device having a stacked semiconductor chip structure is manufactured, productivity may be increased in a process of bonding wafers and then cutting a stacked semiconductor chip. The substrate bonding process may be performed by using a wafer-to-wafer process of directly bonding two wafers without a separate medium therebetween. The wafer-to-wafer process may be performed by using a bonding apparatus which includes a bonding chuck for supporting wafers and an element for pressurizing the wafers.

SUMMARY

The inventive concept provides a substrate bonding apparatus.

According to an exemplary embodiment of the present invention, a substrate bonding apparatus for bonding a first substrate to a second substrate includes a first bonding chuck supporting the first substrate, a second bonding chuck disposed above the first bonding chuck and supporting the second substrate, and a resonant frequency detector detecting a resonant frequency of a bonded structure with the first substrate and the second substrate which are at least partially bonded to each other.

According to an exemplary embodiment of the present invention, a substrate bonding apparatus for bonding a first substrate to a second substrate includes a first bonding chuck supporting the first substrate, a second bonding chuck disposed above the first bonding chuck and supporting the second substrate, a vibration sensor detecting a vibration of a bonded structure with the first substrate and the second substrate which are at least partially bonded to each other, an analyzer detecting a resonant frequency of the bonded structure on the basis of a vibration signal transmitted from the vibration sensor, and a controller detecting a bonding propagation distance corresponding to a diameter of a bonding region of the bonded structure on the basis of the detected resonant frequency of the bonded structure.

According to an exemplary embodiment of the present invention, a substrate bonding apparatus for bonding a first substrate to a second substrate includes a first bonding chuck supporting the first substrate, the first bonding chuck comprising a first deformable plate deforming the first substrate during a time when supporting the first substrate, a second bonding chuck disposed above the first bonding chuck and supporting the second substrate, a vibration sensor provided on the first deformable plate, the vibration sensor detecting a vibration of a bonded structure, the bonded structure including the first substrate and the second substrate that are at least partially bonded to each other, an analyzer detecting a variation of a resonant frequency of the bonded structure, and a controller detecting a bonding propagation distance of the bonded structure on the basis of the detected resonant frequency of the bonded structure.

BRIEF DESCRIPTION OF THE DRAWINGS

Embodiments of the inventive concept will be more clearly understood from the following detailed description taken in conjunction with the accompanying drawings in which:

FIGS. 3A to 3E are cross-sectional views illustrating a substrate bonding method according to embodiments in sequence;

FIG. 4 is a flowchart illustrating a method of detecting a bonding propagation distance, according to embodiments;

DETAILED DESCRIPTION OF THE EMBODIMENTS

Hereinafter, embodiments will be described in detail with reference to the accompanying drawings. Like numeral references refer to like elements, and their repetitive descriptions are omitted.

Figure 1:
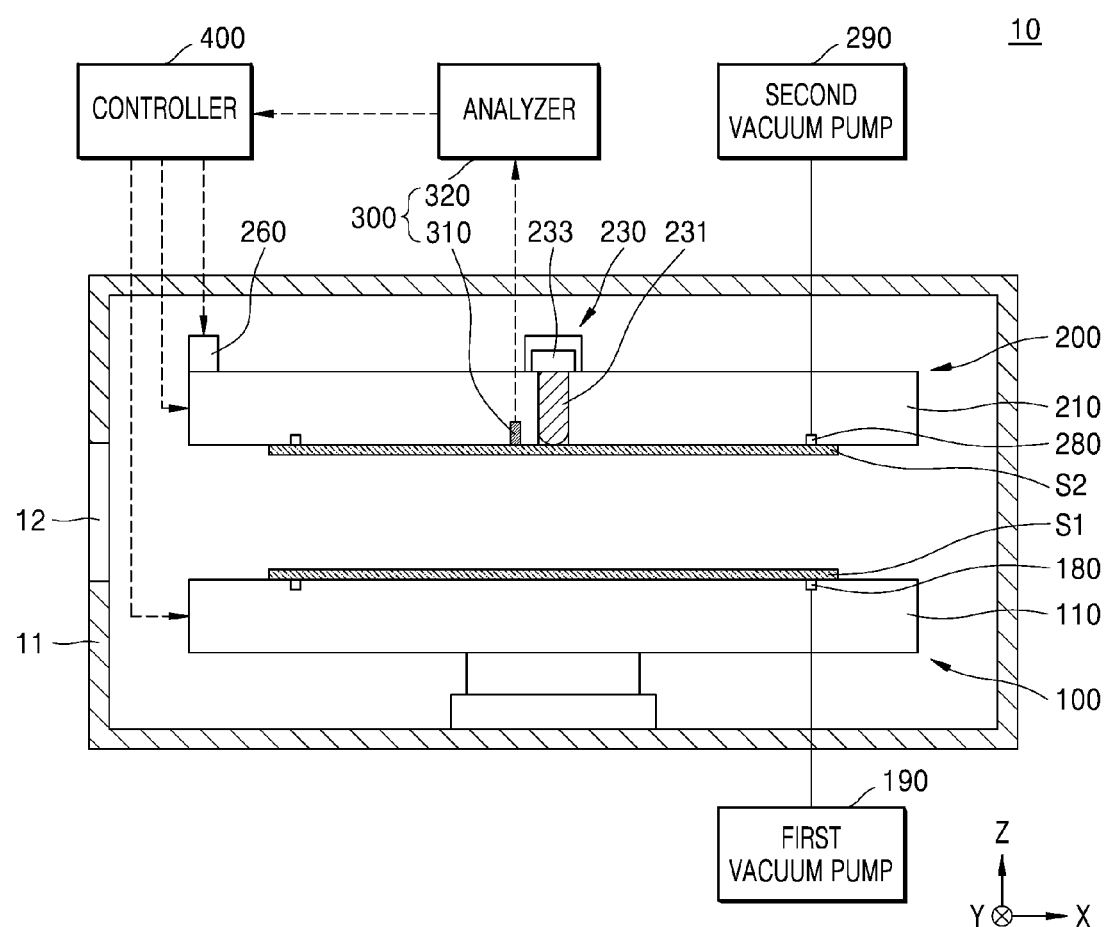
FIG. 1 is a cross-sectional view illustrating a substrate bonding apparatus according to embodiments.

FIG. 1 is a cross-sectional view illustrating a substrate bonding apparatus 10 according to embodiments.

Referring to FIG. 1, the substrate bonding apparatus 10 may include a first bonding chuck 100, a second bonding chuck 200, a resonant frequency detector 300, a controller 400, and a chamber 11 which accommodates the first bonding chuck 100 and the second bonding chuck 200.

The first bonding chuck 100 may support a first substrate S1. In embodiments, the first substrate S1 may include a single crystalline substrate. In embodiments, the first substrate S1 may be a silicon wafer.

The first bonding chuck 100, for example, may be configured to fix the first substrate S1 by using vacuum pressure, or may be configured to support the first substrate S1 with an electrostatic force. When the first bonding chuck 100 is configured to fix the first substrate S1 with vacuum pressure, the first bonding chuck 100 may be configured to apply pressure (i.e., vacuum pressure), which is lower than peripheral pressure, to one surface of the first substrate S1 facing one surface of a first base 110. Alternatively, when the first bonding chuck 100 is configured to fix the first substrate S1 with an electrostatic force, the first bonding chuck 100 may include an electrode which is supplied with power to generate an electrostatic force for fixing the first substrate S1.

In embodiments, the first bonding chuck 100 may include the first base 110 on which the first substrate S1 is placed and a first vacuum pump 190 configured to apply vacuum pressure to a first vacuum groove 180 provided in the first base 110. The first vacuum pump 190 may apply the vacuum pressure to the first vacuum groove 180 so that the first substrate S1 is vacuum-adsorbed onto the one surface of the first base 110, or may release the vacuum pressure of the first vacuum groove 180 so that vacuum-adsorption of the first substrate S1 is released. The first vacuum groove 180 may be formed at a portion of the first base 110 on which an outer region of the first substrate S1 is placed, so that the outer region of the first substrate S1 is fixed to the first bonding chuck 100. However, the present embodiment is not limited thereto, and the first base 110 may include a plurality of vacuum grooves disposed between a center and an outer circumference of the first base 110. For example, the plurality of vacuum grooves disposed in a concentric circle may be provided in the first base 110, and the first vacuum pump 190 may be configured to individually control vacuum pressure of each of the plurality of vacuum grooves provided in the first base 110.

The second bonding chuck 200 may be disposed opposite to the first bonding chuck 100. The second bonding chuck 200 may support the second substrate S2 so that a second bonding surface of the second substrate S2 faces a first bonding surface of the first substrate S1.

The second bonding chuck 200, for example, may be configured to fix the second substrate S2 by using vacuum pressure or to support the second substrate S2 with an electrostatic force. When the second bonding chuck 200 is configured to fix the second substrate S2 with vacuum pressure, the second bonding chuck 200 may be configured to apply the vacuum pressure, which is lower than peripheral pressure, to one surface of the second substrate S2 facing one surface of a second base 210. Alternatively, when the second bonding chuck 200 is configured to fix the second substrate S2 with an electrostatic force, the second bonding chuck 200 may include an electrode which is supplied with power to generate an electrostatic force for fixing the second substrate S2.

In this case, the first bonding chuck 100 may be a lower bonding chuck, and the second bonding chuck 200 may be an upper bonding chuck provided above the first bonding chuck 100. However, the present embodiment is not limited thereto, and the second bonding chuck 200 may be a lower bonding chuck, and the first bonding chuck 100 may be an upper bonding chuck provided above the second bonding chuck 200.

In embodiments, the second bonding chuck 200 may include the second base 210 on which the second substrate S2 is placed and a second vacuum pump 290 configured to apply vacuum pressure to a second vacuum groove 280 provided in the second base 210. The second vacuum pump 290 may apply vacuum pressure to the second vacuum groove 280 so that the second substrate S2 is vacuum-adsorbed onto the one surface of the second base 210, or may release the vacuum pressure of the second vacuum groove 280 so that vacuum-adsorption of the second substrate S2 is released.

In embodiments, the second bonding chuck 200 may include a second pressurization device 230 for pressurizing the second substrate S2. The second pressurization device 230 may include a second pressurization pin 231 configured to perform a reciprocating motion in a direction (for example, a Z direction) substantially vertical to the second substrate S2 and a second pin actuator 233 configured to drive the second pressurization pin 231. For example, the second pin actuator 233 may include a multilayer piezoelectric actuator, a voice coil motor, and a lag and pinion coupled to a motor.

The second pressurization pin 231 may be driven by the second pin actuator 233 and may pressurize a center of the second substrate S2. When bonding between the first substrate S1 and the second substrate S2 is being performed, the second pressurization pin 231 may be configured to downward pressurize a center of the second substrate S2 toward the first substrate S1 so as to vary a displacement of the center of the second substrate S2.

While bonding between the first substrate S1 and the second substrate S2 is being performed, the resonant frequency detector 300 may detect a resonant frequency of a bonded structure where the first substrate S1 is at least partially bonded to the second substrate S2. Here, the bonded structure (for example, see PBS of FIG. 3B) may denote a bonded structure where the first substrate S1 is at least partially bonded to the second substrate S2 between a first time when bonding between the first substrate S1 and the second substrate S2 starts and a second time when bonding between the first substrate S1 and the second substrate S2 is completed. In the bonded structure, an area by which the first substrate S1 is bonded to the second substrate S2 may progressively increase over time as described below.

In embodiments, the resonant frequency detector 300 may include a vibration sensor 310 configured to sense a vibration of the bonded structure and an analyzer 320 configured to detect the resonant frequency of the bonded structure on the basis of a vibration signal sensed by the vibration sensor 310.

The vibration sensor 310 may include various sensors for measuring a vibration of the bonded structure. Here, the vibration sensor 310 may be a sensor for directly sensing a vibration of the bonded structure, or may be a sensor for sensing a physical quantity (for example, a surface displacement of the bonded structure) of the bonded structure for calculating the vibration of the bonded structure by using an appropriate analysis algorithm. For example, the vibration sensor 310 may include a laser Doppler vibrometer, a displacement sensor, an acceleration sensor, a sound wave sensor, a weight sensor, a strain gauge, etc. The vibration sensor 310 may be a contactless sensor or a contact sensor.

In embodiments, the vibration sensor 310 may be mounted on the second base 210 of the second bonding chuck 200 and may be configured to sense a vibration of a surface of the second substrate S2 facing a surface (e.g., a bottom surface) of the second base 210. Alternatively, in other embodiments, the vibration sensor 310 may be mounted on the first base 110 of the first bonding chuck 100 and may be configured to sense a vibration of a surface of the first substrate S1 facing a surface (e.g., a top surface) of the first base 110. Alternatively, in other embodiments, the vibration sensor 310 may be disposed at a point which is outward apart from the first bonding chuck 100 and may be configured to sense a vibration of the bonded structure without contact.

In embodiments, the second pressurization device 230 may be configured to apply a vibration to the bonded structure while bonding between the first and second substrates S1 and S2 is being performed. For example, a second pressurization pin 231 may apply a vibration to a center portion of the second substrate S2. In this case, a vibration of the second pressurization pin 231 may be applied by the second pin actuator 233.

For example, the second pressurization device 230 may be configured to apply a vibration to the bonded structure, in order to more easily detect the vibration of the bonded structure by using the vibration sensor 310. Also, the second pressurization device 230 may be configured to apply a vibration to the bonded structure, for increasing a bonding strength of the first and second substrates S1 and S2.

In other embodiments, the substrate bonding apparatus 10 may further include a vibrator for applying a vibration to the bonded structure.

Alternatively, in other embodiments, in a case where the bonded structure sufficiently vibrates based on a vibration(s) generated by the first bonding chuck 100 and/or the second bonding chuck 200, a process of applying a vibration to the bonded structure by using the second pressurization device 230 or the vibrator may be omitted.

An analyzer 320 may receive a vibration signal output from the vibration sensor 310 and may detect the resonant frequency of the bonded structure on the basis of the vibration signal. The analyzer 320 may execute in real time an analysis algorithm for calculating the resonant frequency of the bonded structure of the first substrate S1 and the second substrate S2 by using the vibration signal output from the vibration sensor 310. For example, the analyzer 320 may be configured to perform a fast Fourier transform (FFT) based on the vibration signal received from the vibration sensor 310. For example, the analyzer 320 may include a computer to perform the analysis algorithm.

The controller 400 may overall control a substrate bonding process using the substrate bonding apparatus 10. The controller 400 may be configured to control an operation of the first bonding chuck 100 and an operation of the second bonding chuck 200, and moreover, may be configured to control a chuck actuator 260 which moves the first bonding chuck 100 and/or the second bonding chuck 200.

In embodiments, the controller 400 may receive the resonant frequency of the bonded structure, detected by the resonant frequency detector 300, and may detect a bonding propagation distance of a bonding region between the first substrate S1 and the second substrate S2 by using the resonant frequency of the bonded structure. A method of calculating the bonding propagation distance by using the resonant frequency of the bonded structure will be described below in detail with reference to FIGS. 4 and 5.

Furthermore, the controller 400 may control the substrate bonding process using the substrate bonding apparatus 10 on the basis of the detected bonding propagation distance. For example, the controller 400 may control operations of the first bonding chuck 100 and the second bonding chuck 200 on the basis of the detected bonding propagation distance, and moreover, may control a distance between the first bonding chuck 100 and the second bonding chuck 200.

The controller 400 may be implemented with hardware, firmware, software, or a combination thereof. For example, the controller 400 may be a computing device such as a workstation computer, a desktop computer, a laptop computer, or a tablet computer. The controller 400 may be a simple controller, a microprocessor, a central processing unit (CPU), a graphics processing unit (GPU), a processor configured with software, dedicated hardware, or firmware. The controller 400 may be implemented with, for example, a general-use computer or application specific hardware such as a digital signal processor (DSP), a field programmable gate array (FPGA), or an application specific integrated circuit (ASIC).

In some embodiments, operations of the controller 400 may be implemented with instructions which are read out and executed by one or more processors, the instructions being stored in a machine-readable medium. Here, the machine-readable medium may include an arbitrary mechanism for storing and/or transmitting information as a type readable by a machine (for example, a computing device). For example, the machine-readable medium may include read only memory (ROM), random access memory (RAM), a magnetic disk storage medium, an optical storage medium, a flash memory device, an electrical, optical, acoustic, or other type of radio signal (for example, a carrier, an infrared signal, a digital signal, or the like), and other arbitrary signals.

The controller 400 may be implemented with firmware, software, routines, or instructions for performing a bonding process. For example, the controller 400 may be implemented with software which receives data for feedback, generates a signal for performing the bonding process, and performs an arithmetic operation.

The chamber 11 may surround the first bonding chuck 100 and the second bonding chuck 200. The chamber 11 may provide an inner space for performing the bonding process on the first substrate S1 and the second substrate S2. In embodiments, vacuum pressure or atmospheric pressure may be generated in the inner space of the chamber 11.

The chamber 11 may include an opening portion 12. The first and second substrates S1 and S2 may be loaded into or unloaded from the inner space of the chamber 11 through the opening portion 12 of the chamber 11. In order to protect the inner space of the chamber 11 from an external environment, the opening portion 12 may be closed or sealed depending on the case.

Figure 2:
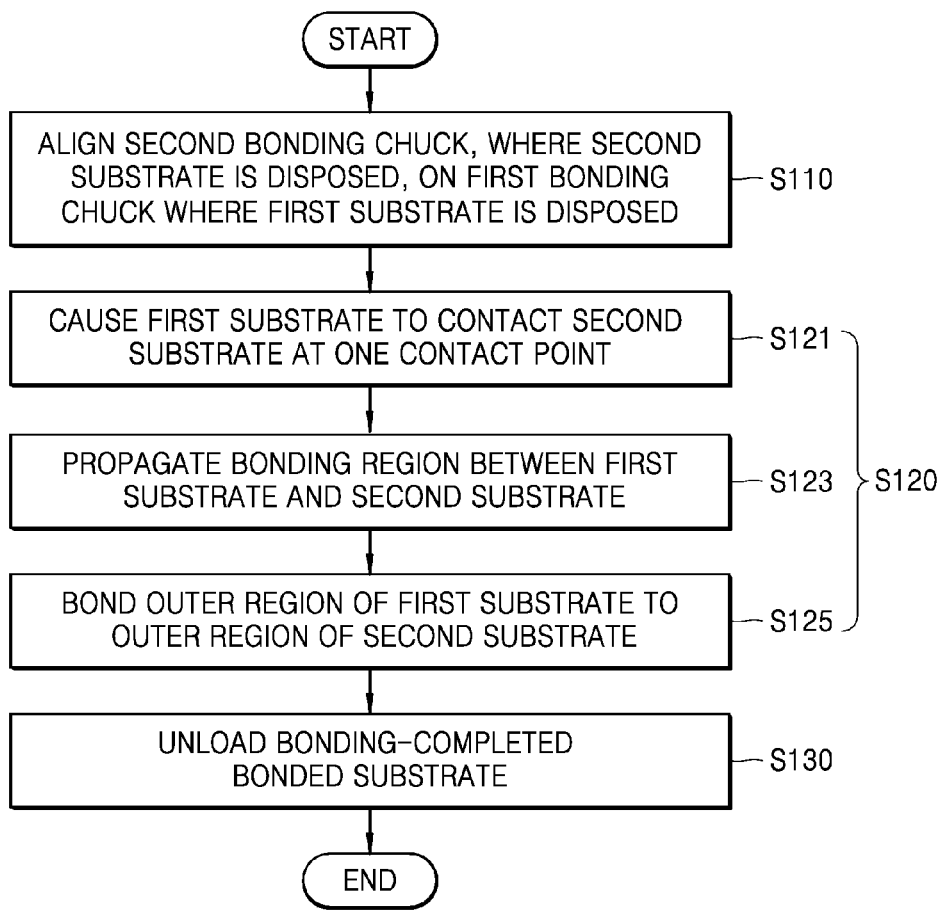
FIG. 2 is a flowchart illustrating a substrate bonding method according to embodiments.

FIG. 2 is a flowchart illustrating a substrate bonding method according to embodiments. FIGS. 3A to 3E are cross-sectional views illustrating a substrate bonding method according to embodiments in sequence. Hereinafter, a substrate bonding method using a substrate bonding apparatus according to embodiments will be described in detail with reference to FIGS. 2 and 3A to 3E.

Figure 3A:
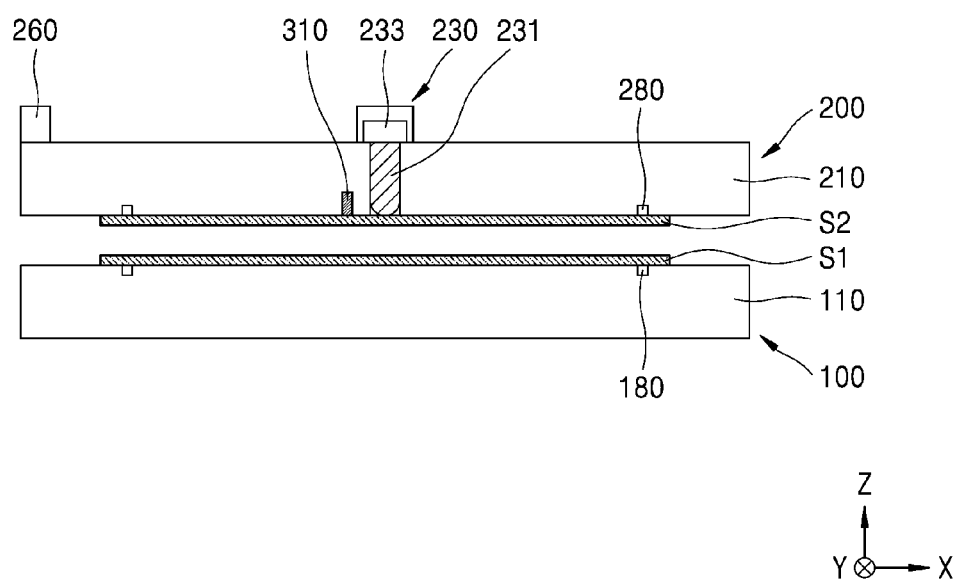

Referring to FIGS. 2 and 3A, the second bonding chuck 200 with the second substrate S2 disposed thereon may be aligned on the first bonding chuck 100 with the first substrate S1 disposed thereon in operation S110.

In operation S110, the first substrate S1 may be mounted on the first bonding chuck 100 so that an inactive surface (i.e., a backside) of the first substrate S1 contacts the first bonding chuck 100, and the second substrate S2 may be mounted on the second bonding chuck 200 so that an inactive surface (i.e., a backside) of the second substrate S2 contacts the second bonding chuck 200. For example, the first bonding chuck 100 may vacuum-adsorb the first substrate S1 so as to fix the first substrate S1, and the second bonding chuck 200 may vacuum-adsorb the second substrate S2 so as to fix the second substrate S2. The second bonding surface of the second substrate S2 mounted on the second bonding chuck 200 may face a first bonding surface of the first substrate S1 mounted on the first bonding chuck 100.

In operation S110, the first bonding chuck 100 and the second bonding chuck 200 may be aligned in a vertical direction (for example, the Z direction). In order to align the first bonding chuck 100 with the second bonding chuck 200, at least one of the first bonding chuck 100 and the second bonding chuck 200 may move in a horizontal direction (for example, an X direction and/or a Y direction), and moreover, may rotate with respect to the vertical direction (for example, the Z direction).

In operation S110, the second bonding chuck 200 may be lowered toward the first bonding chuck 100 and may position the second bonding surface of the second substrate S2, at a predetermined distance in the Z direction, from the first bonding surface of the first substrate S1. For example, a distance in the Z direction between the first bonding surface of the first substrate S1 and the second bonding surface of the second substrate S2 may be about 50 µm to about 200 µm. In embodiments, the distance between the first bonding surface of the first substrate S1 and the second bonding surface of the second substrate S2 may be about 100 µm. When a distance between the first substrate S1 and the second substrate S2 is too large, bonding between the first and second substrates S1 and S2 described below may be poorly propagated. Also, when the distance between the first substrate S1 and the second substrate S2 is too small, the bonding between the first and second substrates S1 and S2 described below may be excessively and rapidly propagated, and due to this, a void may occur between the first and second substrates S1 and S2. Terms such as "about" and "substantial" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Moreover, in order to control the distance between the first substrate S1 and the second substrate S2, the first bonding chuck 100 may be raised, or raising of the first bonding chuck 100 and lowering of the second bonding chuck 200 may be performed simultaneously.

Referring to FIG. 2, the first bonding chuck 100 may be aligned with the second bonding chuck 200, and then, bonding between the first substrate S1 and the second substrate S2 may be performed in operation S120. In embodiments, the bonding between the first substrate S1 and the second substrate S2 may include an operation (S121) of bringing the first substrate S1 into contact with the second substrate S2 at one contact point therebetween, an operation (S123) of propagating a bonding region between the first substrate S1 and the second substrate S2, and an operation (S125) of bonding the outer region of the first substrate S1 to an outer region of the second substrate S2.

Figure 3B:
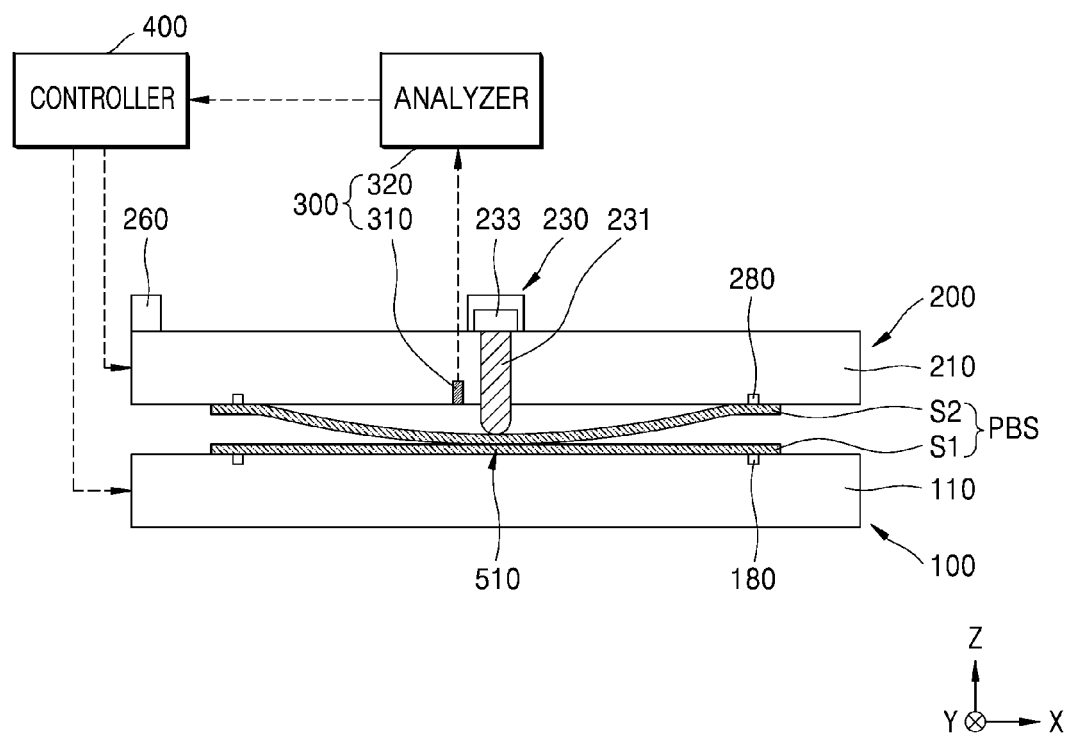

Referring to FIGS. 2 and 3B, in operation S121, in order to initiate the bonding between the first substrate S1 and the second substrate S2, the first substrate S1 may contact the second substrate S2 at one contact point therebetween by using the second pressurization pin 231. As the second pressurization pin 231 pressurizes the center of the second substrate S2, the second substrate S2 pressurized by the second pressurization pin 231 may be convexly deformed and may contact the first substrate S1 at the one contact point between the first substrate S1 and the second substrate S2. The one contact point may be defined as a bonding initiation point 510 from which the bonding between the first substrate S1 and the second substrate S2 starts. For example, the bonding initiation point 510 may be a point at which a center of the first bonding surface of the first substrate S1 contacts a center of the second bonding surface of the second substrate S2. The term "contact," as used herein, refers to a direction connection (i.e., touching) unless the context indicates otherwise.

The first and the second substrates S1 and S2 bonded to each other at the bonding initiation point 510 may form the bonded structure PBS. In the bonded structure PBS, the first substrate S1 may be at least partially bonded to the second substrate S2, and thus, the first substrate S1 and the second substrate S2 may vibrate at the same frequency.

Figure 3C:
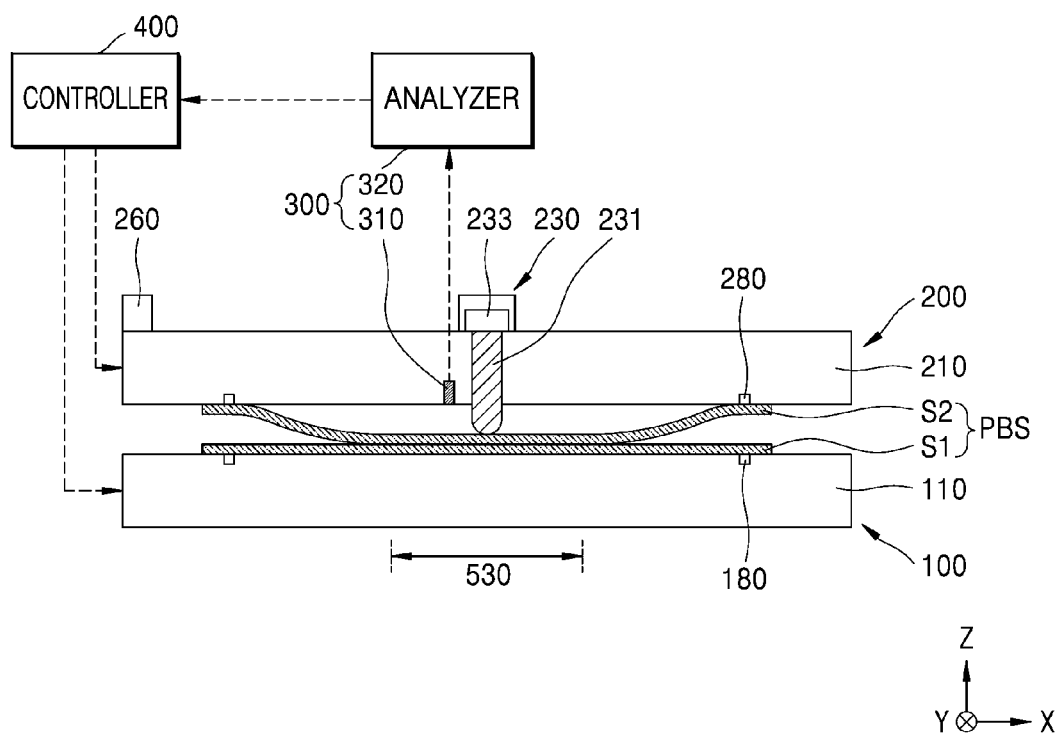
Figure 3D:
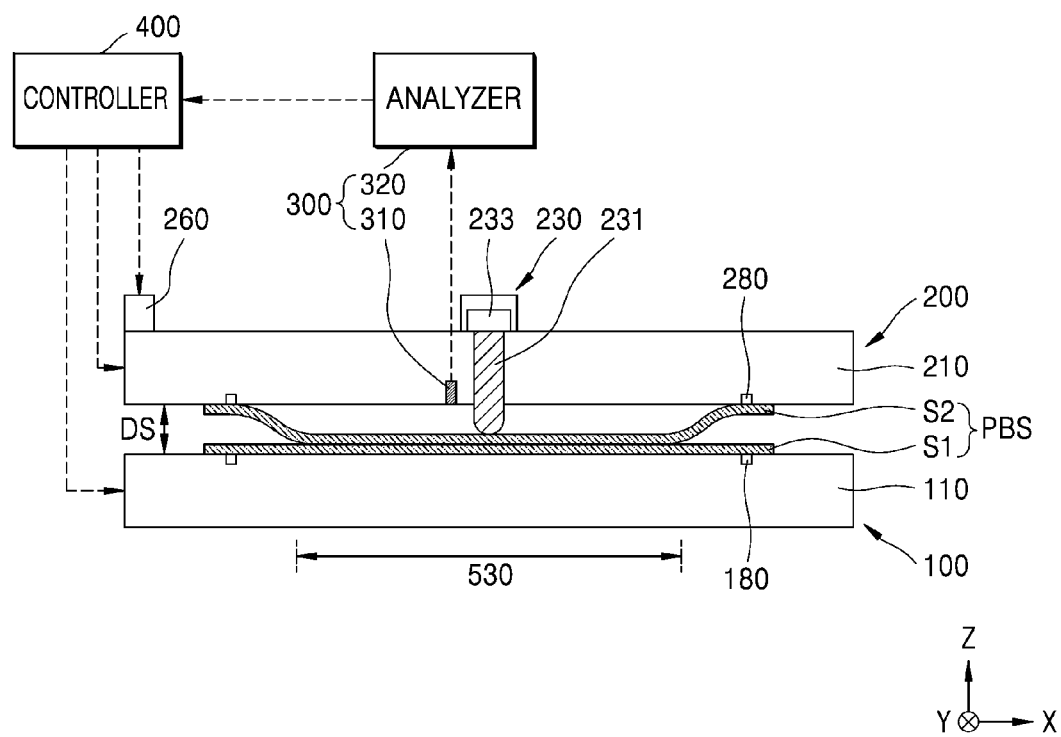

Referring to FIGS. 2, 3C, and 3D, in operation S123, a bonding region between the first substrate S1 and the second substrate S2 may be progressively propagated from the bonding initiation point 510 (FIG. 3B) to the outer regions of the first substrate S1 and the second substrate S2. The bonding region between the first substrate S1 and the second substrate S2 may denote a portion at which the first bonding surface of the first substrate S1 is bonded to the second bonding surface of the second substrate 2, and a bonding propagation distance 530 may denote a diameter of the bonding region or a horizontal width of the bonding region surrounding the bonding initiation point 510.

In embodiments, propagation of the bonding region between the first substrate S1 and the second substrate S2 may be spontaneously performed without another external force being applied thereto. For example, each of the first bonding surface of the first substrate S1 and the second bonding surface of the second substrate S2 may include a plasma-processed or wet-processed surface. For example, a functional group of —OH may be attached to each of the first bonding surface of the first substrate S1 and the second bonding surface of the second substrate S2, and thus, in a process of bonding the first substrate S1 to the second substrate S2, a functional group of —OH of the first bonding surface of the first substrate S1 and a functional group of —OH of the second bonding surface of the second substrate S2 may be spontaneously bonded to each other through a hydrogen bond.

In operation S123, the second bonding chuck 200 may vacuum-adsorb the outer region of the second substrate S2, and thus, the bonding regions of the first substrate S1 and the second substrate S2 may not be propagated up to the outer regions of the first substrate S1 and the second substrate S2 and may be propagated up to a point at which an attraction between the surfaces of the first substrate S1 and the second substrate S2 and an elastic restoring force of the second substrate S2 balance each other.

Referring to FIGS. 2 and 3E, in operation S125, when the second bonding chuck 200 releases vacuum adsorption of the outer region of the second substrate S2, the outer region of the second substrate S2 may freely drop toward the outer region of the first substrate S1, and thus, may be bonded to the outer region of the first substrate S1. When the bonding between the outer region of the first substrate S1 and the outer region of the second substrate S2 is completed, a bonded substrate BS where the bonding surface of the first substrate S1 is totally bonded to the bonding surface of the second substrate S2 may be formed.

Referring to FIG. 2, when the bonding between the first substrate S1 and the second substrate S2 is completed, the bonded substrate BS may be unloaded in operation S130. In order to unload the bonded substrate BS, the second bonding chuck 200 may move in a direction away from the first bonding chuck 100, and the first bonding chuck 100 may totally release vacuum-adsorption of the bonded substrate BS.

Figure 5:
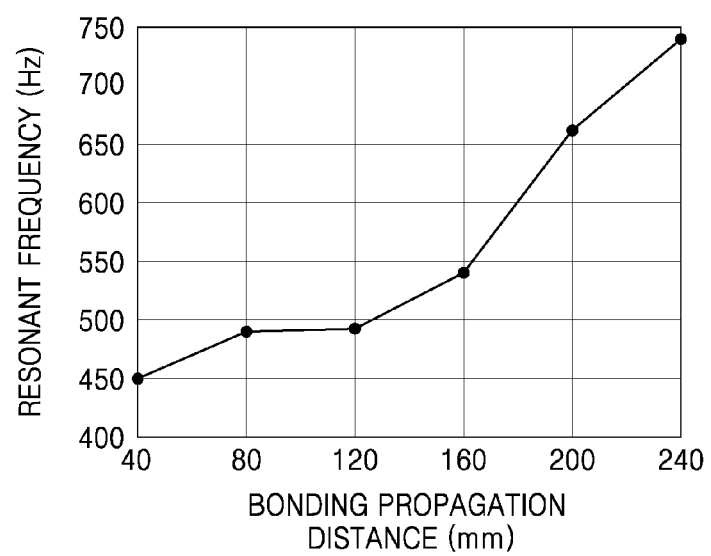
FIG. 5 is a graph showing a relationship between a bonding propagation distance and a resonant frequency of a bonding structure where a first substrate and a second substrate are at least partially bonded.

FIG. 4 is a flowchart illustrating a method of detecting a bonding propagation distance according to embodiments. FIG. 5 is a graph showing a relationship between a bonding propagation distance and a resonant frequency of a bonding structure where the first substrate S1 and the second substrate S2 are at least partially bonded to each other. Hereinafter, a method of detecting a bonding propagation distance by using the substrate bonding apparatus according to embodiments will be described in detail with reference to FIGS. 4 and 5 in conjunction with FIGS. 3A to 3E.

Referring to FIG. 4, when bonding between the first substrate S1 and the second substrate S2 is being performed, the substrate bonding apparatus may detect the bonding propagation distance 530 between the first substrate S1 and the second substrate S2. For example, the substrate bonding apparatus may continuously detect a resonant frequency of the bonded structure PBS from a first time when the center of the second substrate S2 contacts the first substrate S1 and bonding therebetween starts as illustrated in FIG. 3B, to a second time when bonding between the outer region of the first substrate S1 and the outer region of the second substrate S2 is completed. The substrate bonding apparatus may continuously detect the bonding propagation distance between the first substrate S1 and the second substrate S2 on the basis of the detected resonant frequency of the bonded structure PBS.

In embodiments, in order to detect the bonding propagation distance 530 between the first substrate S1 and the second substrate S2, operation S151 of sensing, by using the vibration sensor 310, a vibration of the bonded structure PBS where the first substrate S1 is at least partially bonded to the second substrate S2, operation S153 of detecting the resonant frequency of the bonded structure PBS on the basis of the vibration signal transmitted from the vibration sensor 310, and operation S155 of detecting the bonding propagation distance 530 between the first substrate S1 and the second substrate S2 on the basis of the detected resonant frequency may be performed.

In operation S151, when a bonding region between the first substrate S1 and the second substrate S2 is being propagated from the bonding initiation point 510 (FIG. 3B) to the outer regions of the first substrate S1 and the second substrate S2, the vibration sensor 310 may sense the vibration of the bonded structure PBS.

In operation S151, the substrate bonding apparatus may vibrate the bonded structure PBS by using the vibrator or the second pressurization pin 231 of the second pressurization device 230, and then, may sense the vibration of the bonded structure PBS by using the vibration sensor 310. Alternatively, in embodiments, in a case where the bonded structure PBS sufficiently vibrates based on a vibration(s) generated by the first bonding chuck 100 and/or the second bonding chuck 200, a process of vibrating the bonded structure PBS by using the vibrator or the second pressurization pin 231 of the second pressurization device 230 may be omitted.

In embodiments, the vibration sensor 310 may include a laser Doppler vibrometer for sensing a vibration of a surface of the bonded structure PBS.

In embodiments, the vibration sensor 310 may include a displacement sensor for measuring a displacement of the surface of the bonded structure PBS. For example, the vibration sensor 310 may include a gap sensor for measuring a displacement of a surface of the first substrate S1 or a displacement of a surface of the second substrate S2. The gap sensor may be, for example, an optical gap sensor or a capacitive gap sensor.

In embodiments, the vibration sensor 310 may include a sound wave sensor configured to irradiate a sound wave onto the bonded structure PBS and measure a sound wave reflected from the bonded structure PBS. For example, the sound wave sensor may be configured to irradiate the sound wave onto a space between the second base 210 and the second substrate S2 supported by the second base 210 and measure an acoustic frequency of the space. For example, the vibration sensor 310 may include an ultrasonic sensor.

However, a method of sensing, by using the vibration sensor 310, the vibration of the bonded structure PBS is not limited to the above-described embodiments and may be variously implemented.

In operation S153, the analyzer 320 may receive the vibration signal output from the vibration sensor 310 and may detect the resonant frequency of the bonded structure PBS on the basis of the vibration signal. For example, since the bonded structure PBS vibrates based on the resonant frequency thereof while the bonding between the first substrate S1 and the second substrate S2 is being performed, the analyzer 320 may calculate the resonant frequency of the bonded structure PBS in real time by using the vibration signal transmitted from the vibration sensor 310. For example, since the resonant frequency of the bonded structure PBS may change depending on a size of the bonding region between the first substrate S1 and the second substrate S2, the resonant frequency may be correlated to the bonding propagation distance 530 therebetween.

In operation S155, the controller 400 may detect the bonding propagation distance 530 on the basis of the resonant frequency of the bonded structure PBS, transmitted from the analyzer 320. As illustrated in FIGS. 3B to 3E, when the bonding region between the first substrate S1 and the second substrate S2 is being progressively propagated from the bonding initiation point 510 to the outer regions of the first substrate S1 and the second substrate S2, a size of the bonding region between the first substrate S1 and the second substrate S2 may increase progressively, and the increase in the size of the bonding region may vary the resonant frequency of the bonded structure PBS. In this case, as shown in the graph of FIG. 5, the resonant frequency of the bonded structure PBS may vary based on the bonding propagation distance 530, and the bonding propagation distance 530 may be detected from the detected resonant frequency. The controller 400 may detect the bonding propagation distance 530 in real time by using the resonant frequency of the bonded structure PBS, transmitted from the analyzer 320.

In embodiments, the controller 400 may control a substrate bonding process in real time by using the detected bonding propagation distance 530.

For example, when the bonding region is propagated into the outer regions of the first substrate S1 and the second substrate S2, the chuck actuator 260 may decrease a distance DS (see FIG. 3D) between the first bonding chuck 100 and the second bonding chuck 200. For example, when the distance DS between the first and second bonding chucks 100 and 200 is reduced at a too early time (e.g., prior to the bonding region entering into the outer regions), bonding between the first substrate S1 and the second substrate S2 may be very rapidly propagated, and due to this, a void may occur between the first substrate S1 and the second substrate S2. For example, when the distance DS between the first and second bonding chucks 100 and 200 is reduced at a too late time (e.g., subsequent to the bonding region entering into the outer regions), the bonding between the first substrate S1 and the second substrate S2 may be poorly propagated, or a degree of bonding alignment may be degraded.

In embodiments, when the bonding propagation distance 530 reaches a predetermined target distance, a chuck actuator 260 may lower the second bonding chuck 200 to decrease the distance DS between the first and second bonding chucks 100 and 200. For example, a distance between edges of the first and second substrates S1 and S2 is about 100 μm at a first time when the center of the second substrate S2 contacts the first substrate S1 and bonding therebetween starts, and the chuck actuator 260 may reduce the distance between the edges of the first and second substrates S1 and S2 to a distance between about 10 μm and about 50 μm at a time when the bonding propagation distance 530 reaches the predetermined target distance.

In some embodiments, each of the first and second substrates S1 and S2 has a diameter of about 300 mm, and the target distance may be within a range of about 150 mm to about 260 mm. When the second bonding chuck 200 is lowered at a time before the bonding propagation distance 530 reaches the lower bound of the predetermined target distance of, for example, about 150 mm, a distance between the first substrate S1 and the second substrate S2 may be shortened at a too early time, and due to this, a void may occur between the first substrate S1 and the second substrate S2. Also, when the second bonding chuck 200 is lowered at a time when the bonding propagation distance 530 exceeds the upper bound of the predetermined target distance of, for example, about 260 mm, the bonding between the first substrate S1 and the second substrate S2 may be poorly propagated, or a degree of bonding alignment may be degraded.

FIGS. 6A to 6E are cross-sectional views illustrating a substrate bonding method according to embodiments in sequence.

Figure 6A:
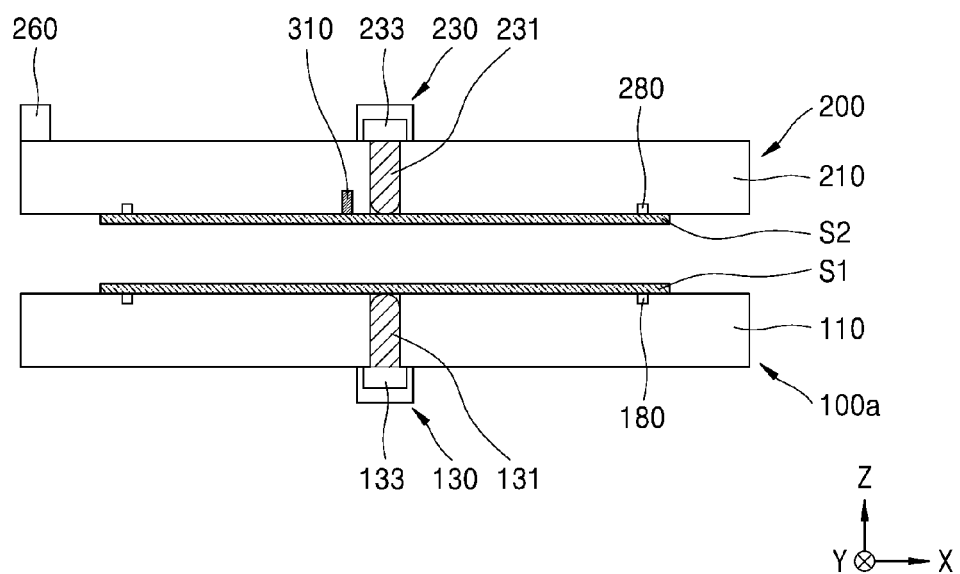
FIGS. 6A to 6E are cross-sectional views illustrating a substrate bonding method according to embodiments in sequence.

Referring to FIG. 6A, a second bonding chuck 200 with a second substrate S2 disposed thereon may be aligned on a first bonding chuck 100a with a first substrate S1 disposed thereon.

The first bonding chuck 100a may include a first pressurization device 130 for pressurizing the first substrate S1. The first pressurization device 130 may include a first pressurization pin 131 configured to perform a reciprocating motion in a direction (for example, a Z direction) substantially vertical to the first substrate S1 and a first pin actuator 133 configured to drive the first pressurization pin 131. For example, the first pin actuator 133 may include a multilayer piezoelectric actuator, a voice coil motor, and a lag and pinion coupled to a motor.

The first pressurization pin 131 may be driven by the first pin actuator 133 and may pressurize a center portion of the first substrate S1. When bonding between the first substrate S1 and the second substrate S2 is being performed, the first pressurization pin 131 may be configured to upward pressurize a center of the first substrate S1 toward the second substrate S2 so as to vary a displacement of a center of the second substrate S2.

In embodiments, the first pressurization device 130 may be configured to vibrate the first pressurization pin 131 to apply a vibration to a bonded structure PBS.

Figure 6B:
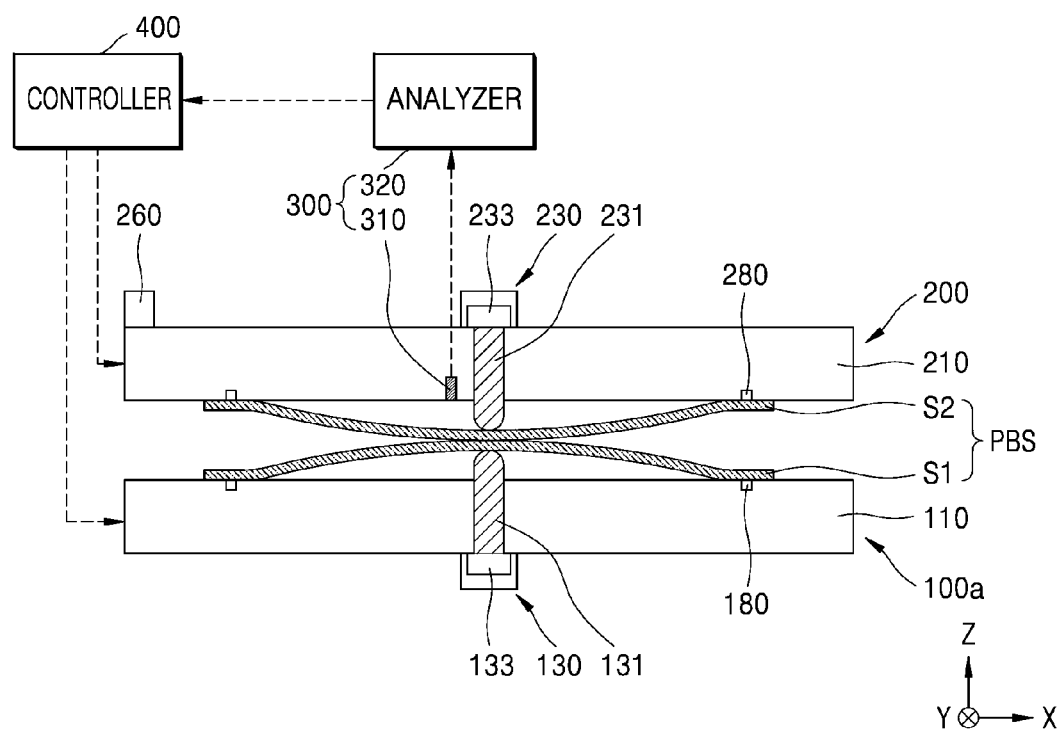

Referring to FIG. 6B, the first pressurization pin 131 of the first pressurization device 130 may be close to the second pressurization pin 231 of the second pressurization device 230. In an example embodiment, the first pressurization pin 131 may be vertically aligned with the second pressurization pin 231. In an example embodiment, the first pressurization pin 131 may be directed to a center of the first substrate S1, and the second pressurization pin 231 may be directed to a center of the second substrate S2. For example, the first pressurization pin 131 may move up to upward pressurize the center of the first substrate S1, and the second pressurization pin 231 may move down to downward pressurize the center of the second substrate S2. The first pressurization pin 131 of the first pressurization device 130 may pressurize the center of the first substrate S1 to convexly deform the first substrate S1. The second pressurization pin 231 of the second pressurization device 230 may pressurize the center of the second substrate S2 to convexly deform the second substrate S2. Since the first substrate S1 and the second substrate S2 are deformed, the first substrate S1 may contact the second substrate S2 at one contact point therebetween. The one contact point may be referred to as a bonding initiation point at which bonding between the first substrate S1 and the second substrate S2 starts.

In embodiments, a distance by which the first pressurization pin 131 moves up to vary a vertical-direction position of the center of the first substrate S1 is referred to as a push height of the first pressurization pin 131 and a distance by which the second pressurization pin 231 moves down to vary a vertical-direction position of the center of the second substrate S2 is referred to as a push height of the second pressurization pin 231. In an example embodiment, the push height of the first pressurization pin 131 may be equal to the push height of the second pressurization pin 231. For example, each of the push height of the first pressurization pin 131 and the push height of the second pressurization pin 231 may be half of a distance between edges of the first and second substrates S1 and S2. However, the inventive concept is not limited thereto, and the push height of the first pressurization pin 131 may differ from the push height of the second pressurization pin 231.

Figure 6C:
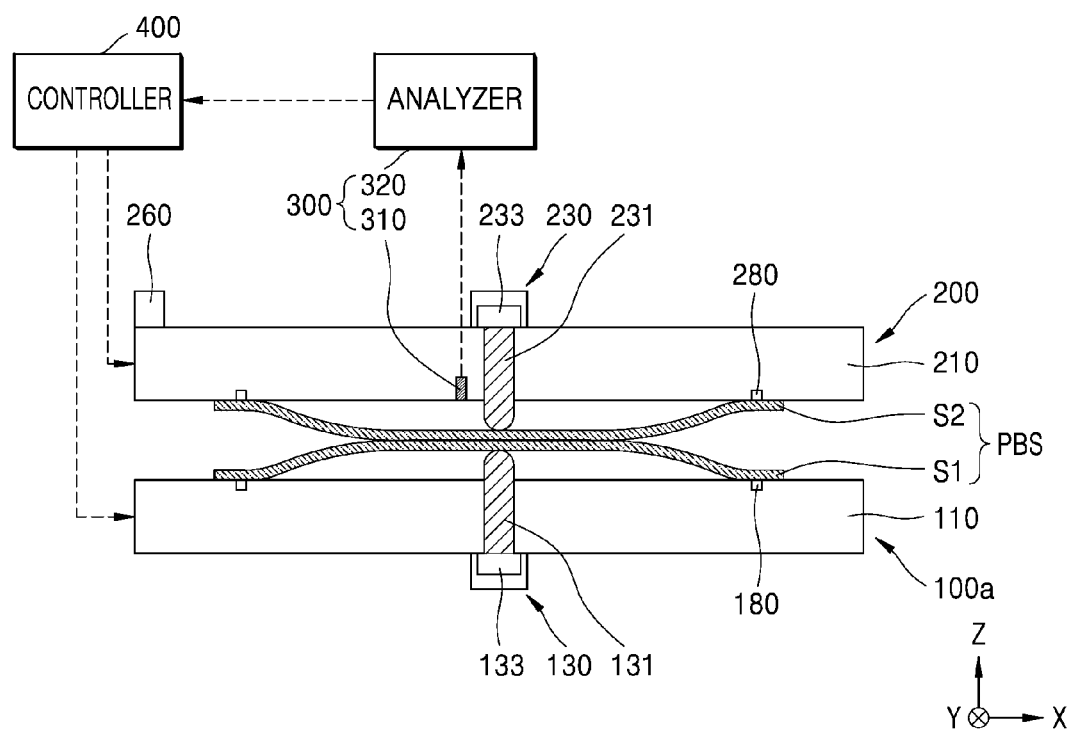
Figure 6D:
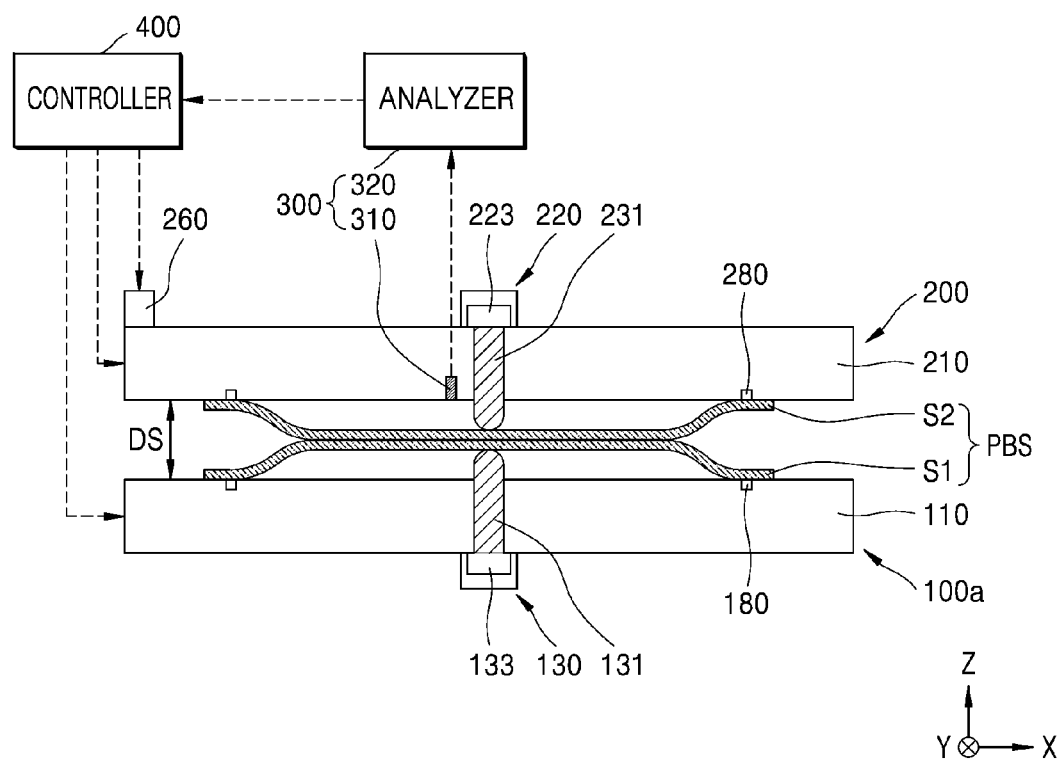

Referring to FIGS. 6C and 6D, a bonding region between the first substrate S1 and the second substrate S2 may be progressively propagated from the bonding initiation point to outer regions of the first substrate S1 and the second substrate S2. As described above, the bonding region between the first substrate S1 and the second substrate S2 may be spontaneously propagated using a chemical bonding such as hydrogen bonding, for example.

In embodiments, when the bonding region between the first substrate S1 and the second substrate S2 is being propagated, at least one of the first pressurization pin 131 and the second pressurization pin 231 may be configured to apply a vibration to the bonded structure PBS. When the bonding region is being propagated, a resonant frequency detector 300 may detect a resonant frequency on the basis of a vibration of the bonded structure PBS sensed by a vibration sensor 310, and a controller 400 may detect in real time a bonding propagation distance on the basis of the resonant frequency of the bonded structure PBS. This has been described above with reference to FIGS. 4 and 5, and thus, a detailed description is omitted.

In embodiments, based on the detected bonding propagation distance, the controller 400 may control a chuck actuator 250 to control a distance DS between the first bonding chuck 100a and the second bonding chuck 200, or may control the first bonding chuck 100a and the second bonding chuck 200 to control the push height of the first pressurization pin 131 and the push height of the second pressurization pin 231.

Figure 6E:
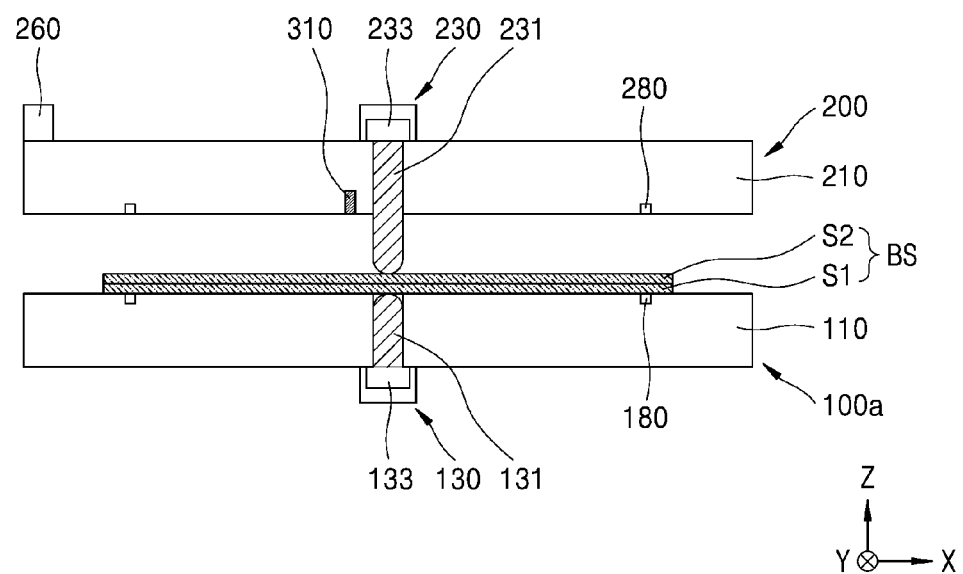

Referring to FIG. 6E, when each of the first pressurization pin 131 and the second pressurization pin 231 moves downward and the second bonding chuck 200 releases vacuum adsorption of the outer region of the second substrate S2, the outer region of the second substrate S2 may be bonded to the outer region of the first substrate S1. When bonding between the outer region of the first substrate S1 and the outer region of the second substrate S2 is completed, a bonded substrate BS, where a bonding surface of the first substrate S1 is totally bonded to a bonding surface of the second substrate S2, may be formed.

Figure 7A:
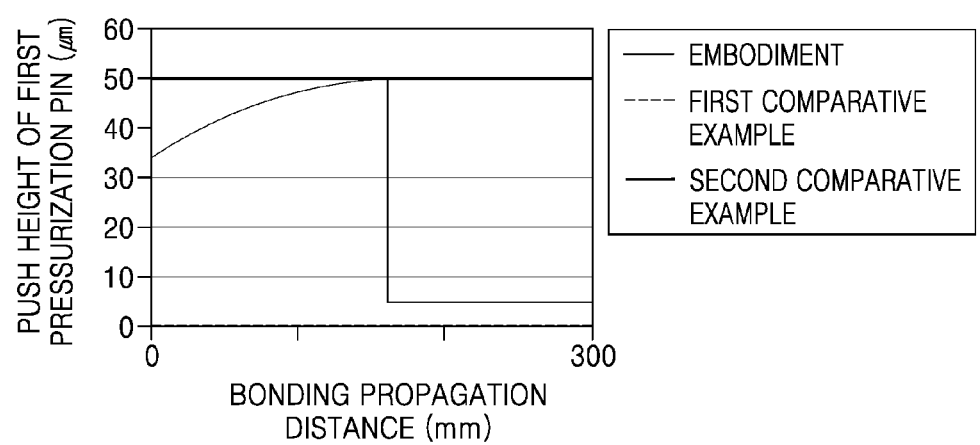
FIGS. 7A and 7B are graphs for describing an example of an operation of a substrate bonding apparatus illustrated in FIGS. 6A to 6E.
Figure 7B:
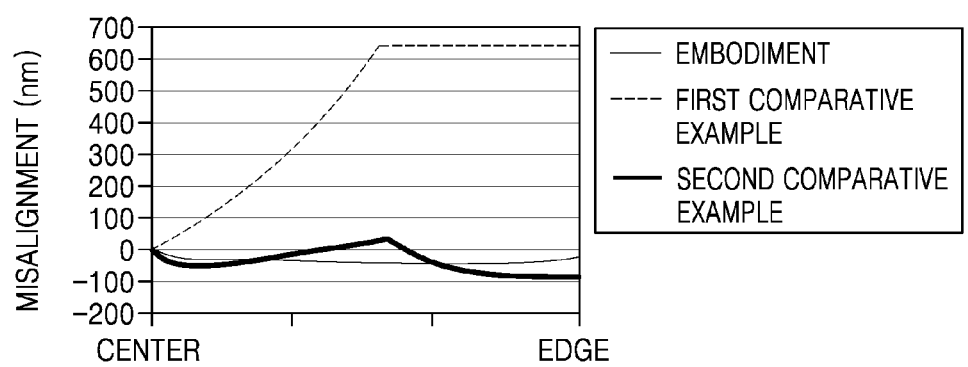

FIGS. 7A and 7B are graphs for describing an example of an operation of a substrate bonding apparatus illustrated in FIGS. 6A to 6E.

FIG. 7A shows a variation of the push height of the first pressurization pin 131 with respect to a detected bonding propagation distance when bonding between the first substrate S1 and the second substrate S2 each having a diameter of about 300 mm is being performed. In the graph shown in FIG. 7A, the abscissa axis represents a bonding propagation distance detected by the controller 400 between a first time when the bonding between the first substrate S1 and the second substrate S2 starts and a second time when the bonding between the outer regions of the first substrate S1 and the second substrate S2 is completed, and the ordinate axis represents the push height of the first pressurization pin 131. FIG. 7B is a graph showing misalignment of bonding between a center and an edge of a bonding-completed bonded substrate (see BS of FIG. 6E). In the graph shown in FIG. 7B, as a variation amount of the second substrate S2 is relatively large, a curve representing misalignment has a positive slope, and as a variation amount of the first substrate S1 is relatively large, a curve representing misalignment has a negative slope. Hereinafter, an example of an operation according to an embodiment and examples of operations according to a first comparative example and a second comparative example will be described with reference to FIGS. 7A and 7B in conjunction with FIGS. 6A to 6E.

The first comparative example is a case where a distance between edges of the first and second substrates S1 and S2 is maintained constant at about 50 μm between the first time and the second time, the push height of the second pressurization pin 231 is constantly 50 μm between the first time and the second time, and the push height of the first pressurization pin 131 is 0 μm between the first time and the second time. In the first comparative example, the first substrate S1 maintains a flat state, and the second substrate S2 is bonded to the first substrate S1 in a state where the second substrate S2 is deformed by second pressurization pin 231. Since the first substrate S1 is asymmetrically bonded to the second substrate S2, bonding misalignment of the bonded substrate may be relatively large.

The second comparative example is a case where a distance between the edges of the first and second substrates S1 and S2 is maintained constant at about 100 μm between the first time and the second time and each of the push height of the first pressurization pin 131 and the push height of the second pressurization pin 231 is constantly 50 μm between the first time and the second time. In this case, the first and second substrates S1 and S2 are relatively symmetrically deformed and are bonded to each other, but a variation amount of each of the first and second substrates S1 and S2 in a radius direction thereof varies due to an external factor such as gravity, whereby bonding misalignment occurs in the bonded substrate.

An embodiment is a case where a distance between the edges of the first and second substrates S1 and S2 is maintained to about 100 μm at the first time and a sum of the push height of the first pressurization pin 131 and the push height of the second pressurization pin 231 is constantly 100 μm between the first time and the second time. The push height of the first pressurization pin 131 increases gradually between the first time and a target time at which a bonding propagation distance reaches a target distance, decreases rapidly at the target time, and is then fixed until the second time. Since the sum of the push height of the first pressurization pin 131 and the push height of the second pressurization pin 231 is constant between the first time and the second time, the push height of the second pressurization pin 231 decreases gradually between the first time and the target time, increases rapidly at the target time, and is fixed until the second time subsequently.

To describe in more detail a curve representing misalignment of a bonded substrate according to the second comparative example, it may be seen that the curve has a negative slope because a variation amount of the first substrate S1 is relatively large in a first time period from the first time, the curve has a positive slope because a variation amount of the second substrate S2 is relatively large in a second time period subsequently, and the curve has a negative slope because a variation amount of the first substrate S1 is relatively large in a third time period.

In an embodiment, an operation of the first pressurization pin 131 and an operation of the second pressurization pin 231 may be set based on the second comparative example. For example, in the second time period where a variation amount of the second substrate S2 is relatively large in the second comparative example, an embodiment may progressively increase the push height of the first pressurization pin 131 and may progressively decrease the push height of the second pressurization pin 231 to progressively increase a variation amount of the first substrate S1 and progressively decrease a variation amount of the second substrate S2. Also, in the third time period where a variation amount of the first substrate S1 is relatively large in the second comparative example, an embodiment may allow the push height of the first pressurization pin 131 to be less than the push height of the second pressurization pin 231, and thus, may relatively decrease a variation amount of the first substrate S1 and may relatively increase a variation amount of the second substrate S2. In embodiments, at an initial step of the third time period, the push height of the first pressurization pin 131 may decrease rapidly, and the push height of the second pressurization pin 231 may increase rapidly.

According to embodiments, an operation of the first pressurization pin 131 and an operation of the second pressurization pin 231 may be controlled at an appropriate time by using the detected bonding propagation distance, thereby enhancing a bonding precision of the first and second substrates S1 and S2.

Figure 8:
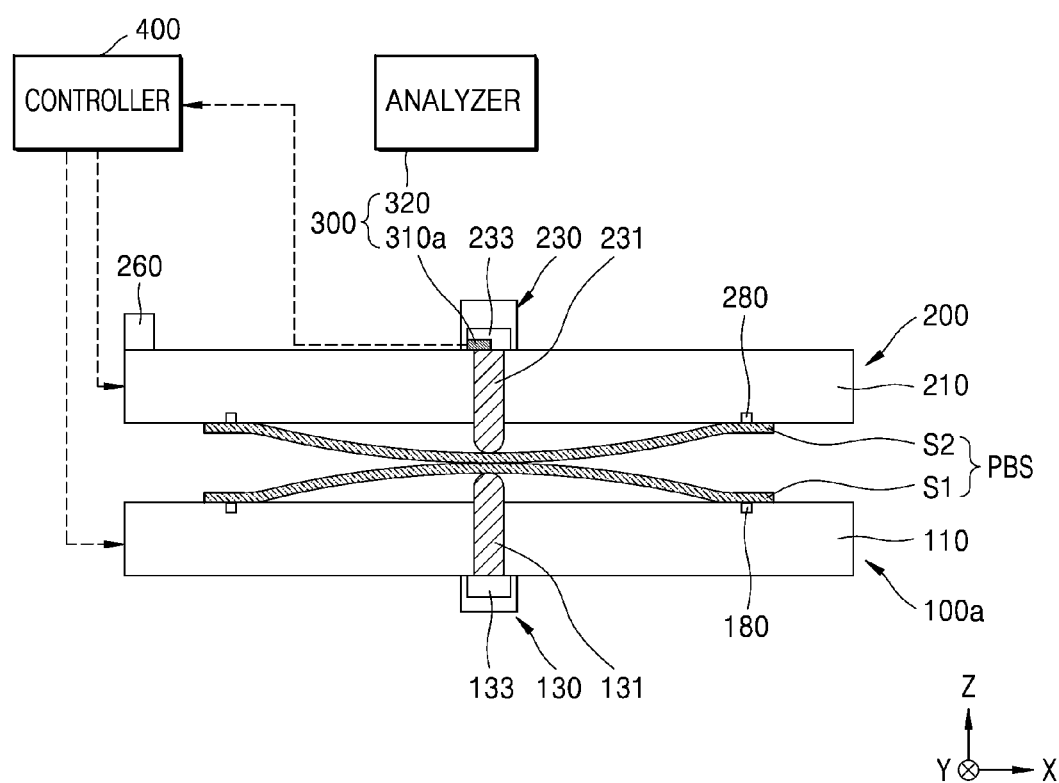
FIG. 8 is a cross-sectional view illustrating a substrate bonding apparatus according to embodiments.

FIG. 8 is a cross-sectional view illustrating a substrate bonding apparatus according to embodiments. Except for the arrangement of a vibration sensor 310a, the substrate bonding apparatus illustrated in FIG. 8 may be substantially the same as or similar to the substrate bonding apparatus illustrated in FIGS. 6A to 6E. For convenience of description, descriptions which are the same as or similar to the above descriptions are omitted.

Referring to FIG. 8, the vibration sensor 310a may be installed in a second pressurization device 230 of a second bonding chuck 200. For example, the vibration sensor 310a may be configured to sense a vibration of the second pressurization pin 231. Because the second pressurization pin 231 may contact and pressurize a second substrate S2 when bonding between a first substrate S1 and the second substrate S2 is being performed, the vibration sensor 310a may sense a vibration of a bonded structure PBS by using a vibration of the second pressurization pin 231 sensed by the vibration sensor 310a.

In embodiments, the vibration sensor 310a may be provided in the second pressurization pin 231. The vibration sensor 310a may include a weight sensor, a load cell, a strain gauge, a displacement sensor, or an acceleration sensor.

In FIG. 8, the vibration sensor 310a is illustrated as being provided in the second pressurization device 230 of the second bonding chuck 200, but is not limited thereto and may be provided in a first pressurization device 130 of a first bonding chuck 100a.

FIGS. 9A to 9E are cross-sectional views illustrating a substrate bonding method according to embodiments in sequence.

Figure 9A:
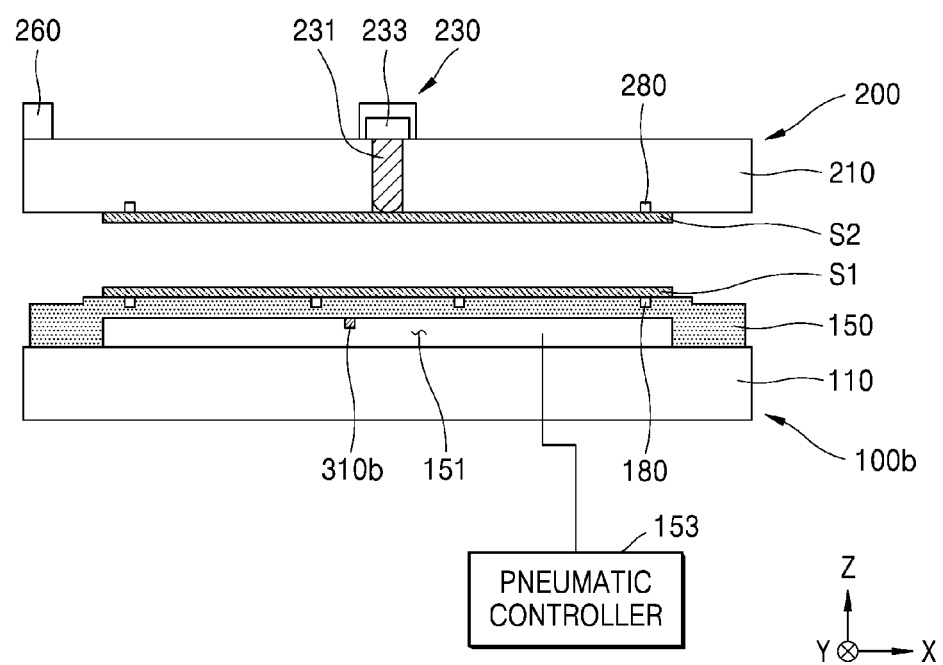
FIGS. 9A to 9E are cross-sectional views illustrating a substrate bonding method according to embodiments in sequence.

Referring to FIG. 9A, a second bonding chuck 200 with a second substrate S2 disposed thereon may be aligned above a first bonding chuck 100b with a first substrate S1 disposed thereon.

The first bonding chuck 100b may include a first deformable plate 150 disposed on a first base 110. The first deformable plate 150 may support a first vacuum groove 180. A first vacuum pump may apply vacuum pressure to the first vacuum groove 180 so that the first substrate S1 is vacuum-adsorbed onto one surface of the first deformable plate 150, or may release the vacuum pressure of the first vacuum groove 180 to remove the vacuum adsorption of the first substrate S1.

The first deformable plate 150 may be mounted on the first base 110 such that a distance between the first deformable plate 150 and the first base 110 is variable. For example, an outer circumference of the first deformable plate 150 may be fixed to the first base 110, and an inner portion of the fixed outer circumference of the first deformable plate 150 may be convexly deformed by an external force. The first deformable plate 150 may be deformed with supporting the first substrate S1, and thus, may forcibly deform the first substrate S1. At this time, a curvature of the forcibly-deformed first substrate S1 may be varied according to a curvature of the first deformable plate 150.

In embodiments, the first deformable plate 150 may include metal, ceramic, rubber, or a combination thereof. For example, the first deformable plate 150 may include aluminum or silicon carbide (SiC).

A pneumatic controller 153 may control pressure of a first cavity 151 provided between the first base 110 and the first deformable plate 150 to deform the first deformable plate 150. The pneumatic controller 153 may inject air into the first cavity 151 to increase pressure of the first cavity 151, or exhaust the air of the first cavity 151 to decrease pressure of the first cavity 151. When the pressure of the first cavity 151 increases by the pneumatic controller 153, the first deformable plate 150 may be deformed to increase a curvature thereof, and moreover, the first substrate S1 supported by the first deformable plate 150 may be deformed to increase a curvature thereof. Also, when the pressure of the first cavity 151 is reduced by the pneumatic controller 153, the first deformable plate 150 may be deformed to decrease the curvature thereof, and moreover, the first substrate S1 supported by the first deformable plate 150 may be deformed to decrease the curvature thereof.

Figure 9B:
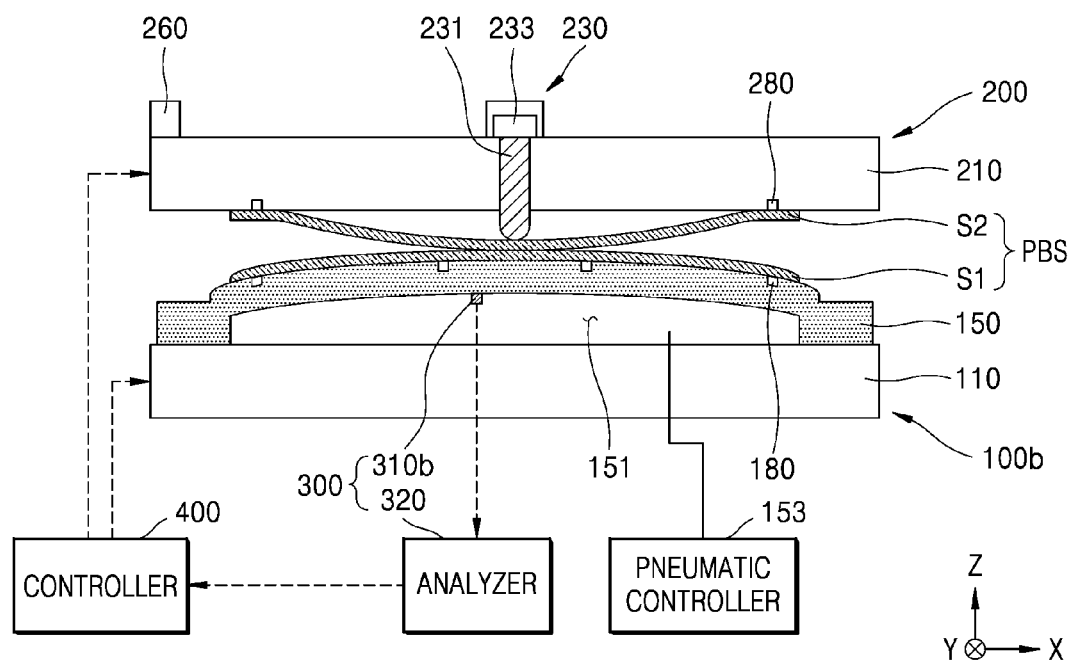

Referring to FIG. 9B, the first deformable plate 150 may be deformed with supporting the first substrate S1, and thus, may forcibly deform the first substrate S1 supported by one surface of the first deformable plate 150. For example, the first deformable plate 150 may be deformed convexly in an upward direction with vacuum-adsorbing the first substrate S1, and the first substrate S1 may be forcibly deformed convexly in an upward direction on the basis of the deformation of the first deformable plate 150.

The second substrate S2 may be pressurized and deformed convexly in a downward direction on the basis of the deformation of the first substrate S1. As the first substrate S1 and the second substrate S2 are deformed, the first substrate S1 may contact the second substrate S2 at one contact point therebetween. The one contact point may be referred to as a bonding initiation point at which bonding between the first substrate S1 and the second substrate S2 starts.

Figure 9C:
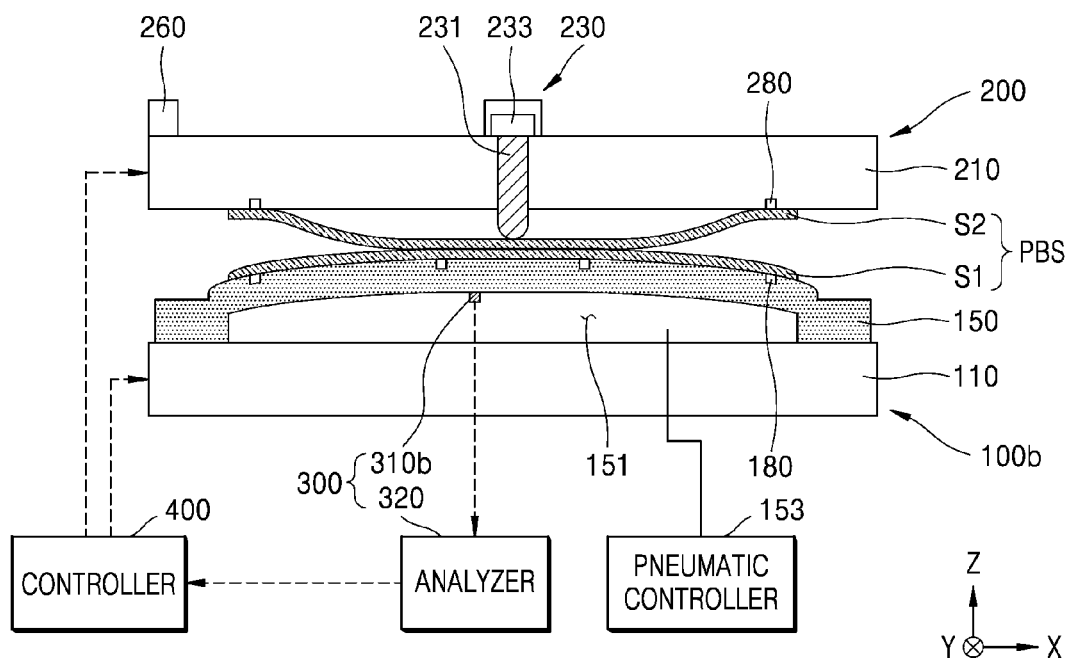
Figure 9D:
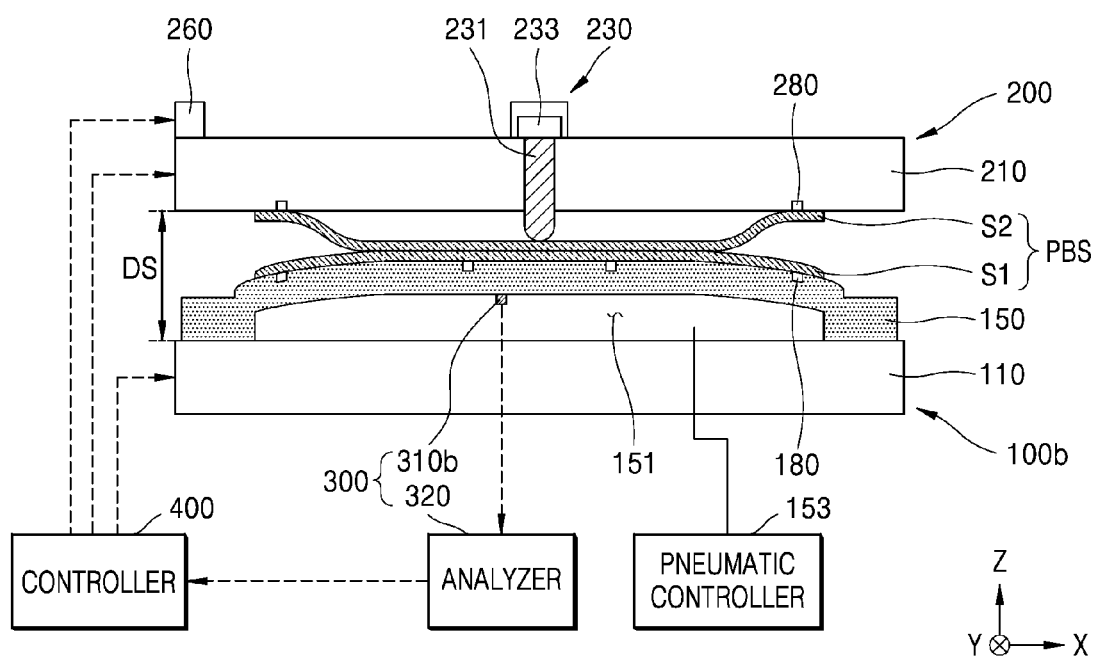

Referring to FIGS. 9C and 9D, a bonding region between the first substrate S1 and the second substrate S2 may be progressively propagated from the bonding initiation point to outer regions of the first substrate S1 and the second substrate S2. As described above, the bonding region between the first substrate S1 and the second substrate S2 may be spontaneously propagated by a chemical bonding such as hydrogen bonding. When the bonding region is being propagated, a vibration sensor 310b may be provided on the first deformable plate 150 and may sense a vibration of the first deformable plate 150. When bonding between the first and second substrates S1 and S2 is being performed, the first deformable plate 150 may support the first substrate S1, and thus, the vibration sensor 310b provided on the first deformable plate 150 may sense a vibration of a bonded structure PBS. In embodiments, the vibration sensor 310b may include a weight sensor, a load cell, a strain gauge, a displacement sensor, or an acceleration sensor.

When the bonding region is being propagated, a resonant frequency detector 300 may detect a resonant frequency on the basis of the vibration of the bonded structure PBS sensed by the vibration sensor 310b, and a controller 400 may detect in real time a bonding propagation distance on the basis of the detected resonant frequency of the bonded structure PBS. This has been described above with reference to FIGS. 4 and 5, and thus, a detailed description is omitted.

In embodiments, when the bonding between the first substrate S1 and the second substrate S2 is propagated, a chuck actuator 260 may decrease a distance DS between the first bonding chuck 100b and a second bonding chuck 200 to progressively flatten a surface of the first deformable plate 150 in a direction from a center thereof to an outer portion thereof, thereby enabling bonding surfaces of the first and second substrates S1 and S2 to be bonded to each other in a flat state. In this case, the pneumatic controller 153 may lower pressure of a cavity to cause the surface of the first deformable plate 150 to become flat.

Figure 9E:
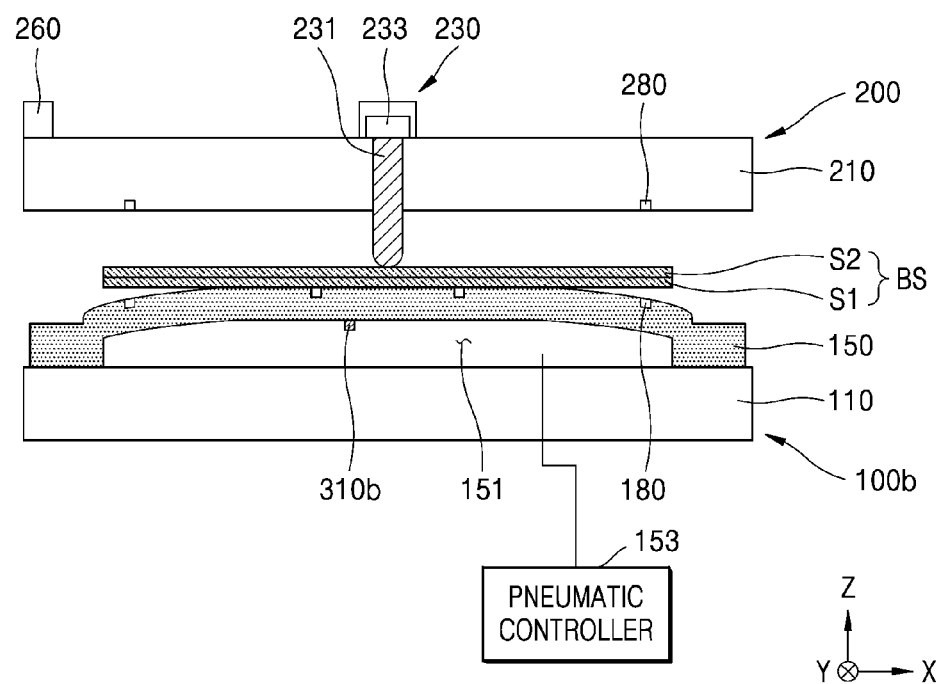

Referring to FIG. 9E, when the first bonding chuck 100b and the second bonding chuck 200 respectively releases vacuum adsorption of an outer region of the first substrate S and vacuum adsorption of an outer region of the second substrate S2, the outer region of the second substrate S2 may be bonded to the outer region of the first substrate S1. When bonding between the outer region of the first substrate S1 and the outer region of the second substrate S2 is completed, a bonded substrate BS where a bonding surface of the first substrate S1 is totally bonded to a bonding surface of the second substrate S2 may be formed.

Figure 10:
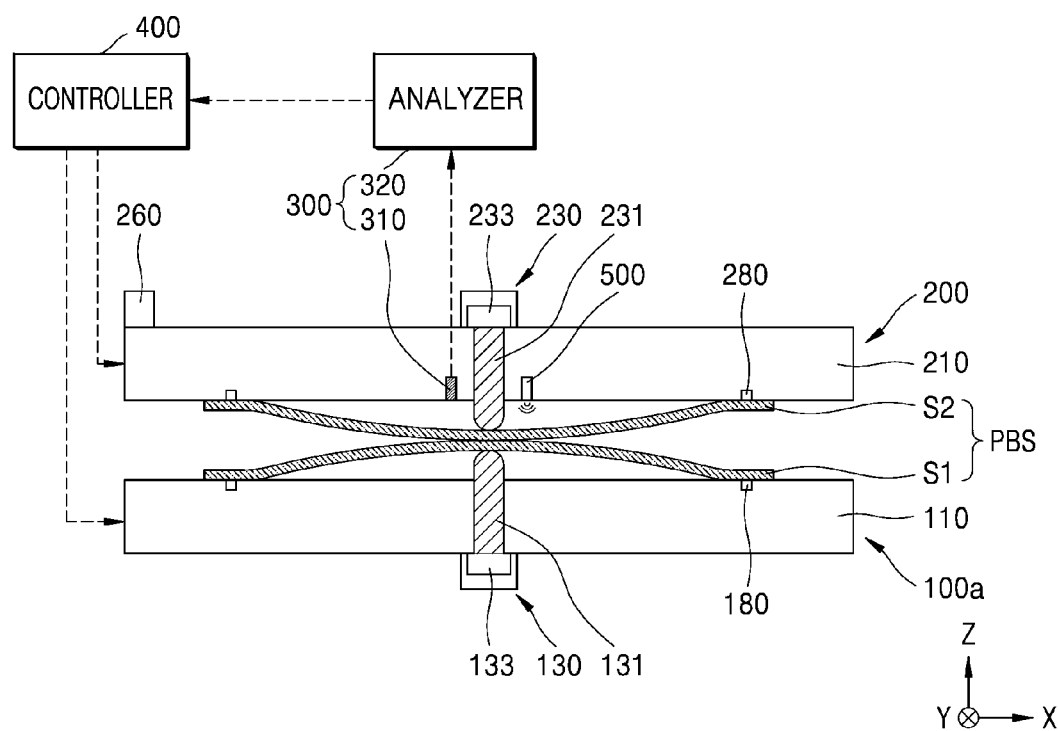
FIG. 10 is a cross-sectional view illustrating a substrate bonding apparatus according to embodiments.

FIG. 10 is a cross-sectional view illustrating a substrate bonding apparatus according to embodiments. Except for that the substrate bonding apparatus illustrated in FIG. 10 further includes a vibrator 500, the substrate bonding apparatus illustrated in FIG. 10 may be substantially the same as or similar to the substrate bonding apparatus illustrated in FIGS. 6A to 6E. For convenience of description, descriptions which are the same as or similar to the above descriptions are omitted.

Referring to FIG. 10, the substrate bonding apparatus according to an embodiment may include a vibrator 500 configured to apply a vibration to a bonded structure PBS when bonding between first and second substrates S1 and S2 is being performed. The vibrator 500 may apply a vibration to the bonded structure PBS so as to more easily detect a vibration of the bonded structure PBS using a vibration sensor 310, or may apply a vibration to the bonded structure PBS so as to increase bonding strength between the first and second substrates S1 and S2.

In embodiments, the vibrator 500 may vibrate the bonded structure PBS without contact. For example, the vibrator 500 may include an ultrasonic vibrator or a speaker mounted on a second base 210 of a second bonding chuck 200.

In FIG. 10, the vibrator 500 is illustrated as being provided in the second pressurization device 230 of the second bonding chuck 200, but is not limited thereto and may be provided in a first base 110 of a first bonding chuck 100a.

Figure 11:
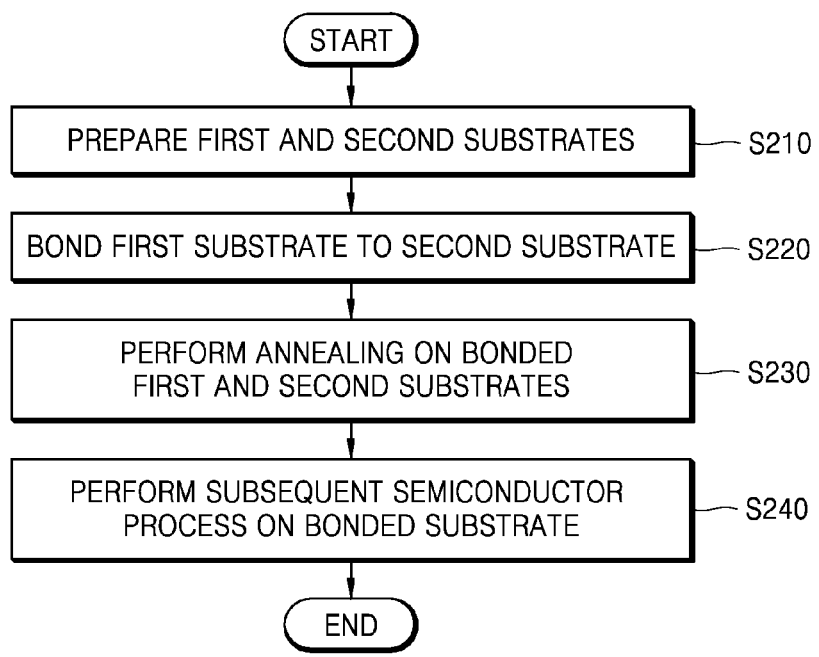
FIG. 11 is a flowchart illustrating a method of manufacturing a semiconductor device, according to embodiments.
Figure 12A:
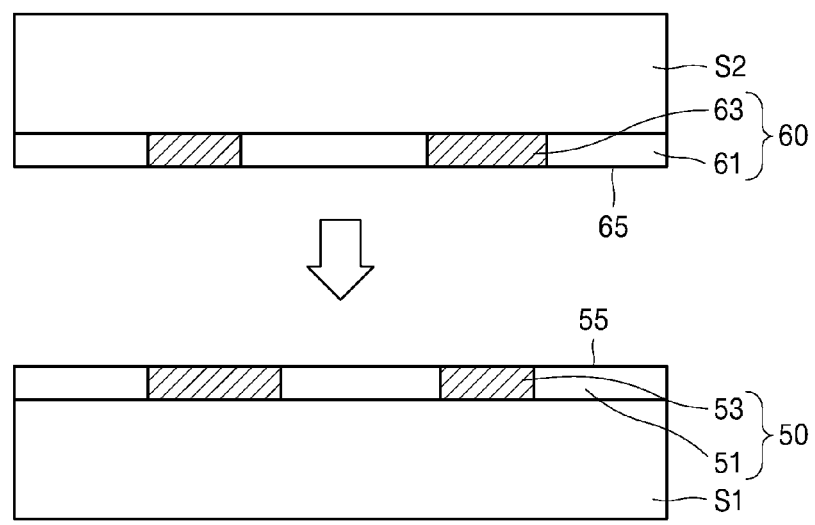
FIGS. 12A and 12B are cross-sectional views illustrating a process of bonding a first substrate to a second substrate in sequence.
Figure 12B:
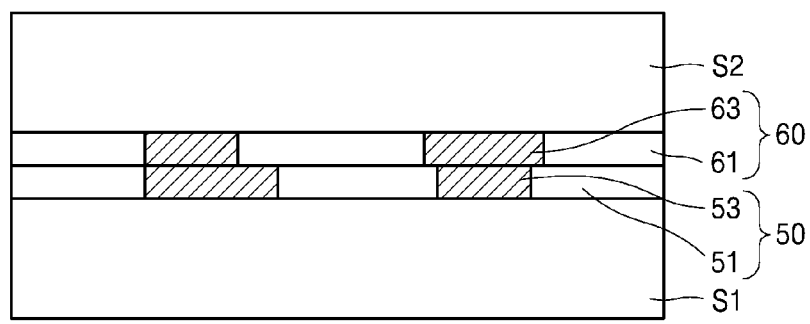

FIG. 11 is a flowchart illustrating a method of manufacturing a semiconductor device according to embodiments. FIGS. 12A and 12B are cross-sectional views illustrating a process of bonding a first substrate S1 to a second substrate S2 in sequence. Hereinafter, a method of manufacturing a semiconductor device according to embodiments will be described with reference to FIGS. 11, 12A, and 12B.

Referring to FIGS. 11 and 12A, the first substrate S1 and the second substrate S2 which are to be bonded may be prepared in operation S210.

Each of the first and second substrates S1 and S2 may include an active surface, on which a semiconductor structure is provided, and an inactive surface opposite to the active surface. The active surface may correspond to a front surface of each of the first and second substrates S1 and S2, and the inactive surface may correspond to a backside surface of each of the first and second substrates S1 and S2. In embodiments, the first substrate S1 may include a first semiconductor structure 50 provided on the active surface thereof, and the second substrate S2 may include a second semiconductor structure 60 provided on the active surface thereof.

Each of the first and second substrates S1 and S2 may be, for example, a single crystalline substrate or a silicon wafer. Alternatively, each of the first and second substrates S1 and S2 may include a semiconductor element such as germanium (Ge), or may include a compound semiconductor such as silicon carbide (SiC), gallium arsenide (GaAs), indium arsenide (InAs), or indium phosphide (InP).

The first semiconductor structure 50 may include a first insulation layer 51 and a first conductive pattern 53, and the second semiconductor structure 60 may include a second insulation layer 61 and a second conductive pattern 63. Each of the first and second insulation layers 51 and 61 may include, for example, silicon oxide. Each of the first and second conductive patterns 53 and 63 may include, for example, copper (Cu). Also, in embodiments, each of the first and second semiconductor structures 50 and 60 may include a semiconductor device layer configuring a plurality of individual devices and a wiring structure layer for electrically connecting the plurality of individual devices.

The plurality of individual devices may be a volatile memory and/or a non-volatile memory. The volatile memory may be, for example, dynamic random access memory (DRAM) or static random access memory (SRAM), and the non-volatile memory may be, for example, flash memory, magnetic random access memory (MRAM), or phase change random access memory (PRAM). Alternatively, a logic chip, a system-on chip (SoC), an application specific integrated circuit (ASIC), or an image sensor chip may be provided in each of the first and second substrates S1 and S2. The wiring structure layer may include a metal wiring layer and/or a via plug. The wiring structure layer may be, for example, a multi-layer (or multi-level) structure where two or more metal wiring layers and/or two or more via plugs are alternately stacked.

In embodiments, the first substrate S1 may be a wafer including a logic chip, and the second substrate S2 may be a wafer including a memory chip. Alternatively, the first substrate S1 may be a wafer including a logic chip, and the second substrate S2 may be a wafer including an image sensor chip.

Referring to FIGS. 11 and 12B, the first substrate S1 may be bonded to the second substrate S2 in operation S220. A first bonding chuck (see 100 of FIG. 1) and a second bonding chuck (see 200 of FIG. 2) may perform aligned bonding between the first substrate S1 and the second substrate S2. When the first substrate S1 is bonded to the second substrate S2, a surface (55 of FIG. 12A) of the first semiconductor structure 50 may contact a surface (65 of FIG. 12A) of the second semiconductor structure 60, and the first conductive pattern 53 of the first semiconductor structure 50 may contact the second conductive pattern 63 of the second semiconductor structure 60.

Referring to FIG. 11, when bonding between the first substrate S1 and the second substrate S2 is completed by using the substrate bonding apparatus 10, annealing may be performed on the bonded first and second substrates S1 and S2 so as to increase bonding strength between the first substrate S1 and the second substrate S2 in operation S230. Based on the annealing, the first conductive pattern 53 of the first semiconductor structure 50 may be more solidly bonded to the second conductive pattern 63 of the second semiconductor structure 60, and the first insulation layer 51 of the first semiconductor structure 50 may be more solidly bonded to the second insulation layer 61 of the second semiconductor structure 60.

Referring to FIG. 11, a subsequent semiconductor process may be performed on a bonded substrate 70 including the bonded first and second substrates S1 and S2 in operation S240. The subsequent semiconductor process may include various processes. For example, the subsequent semiconductor process may include a deposition process, an etch process, an ion process, and a cleaning process. Here, the deposition process may include various material layer forming processes such as a chemical vapor deposition (CVD) process, a sputtering process, and a spin coating process. The ion process may include processes such as ion injection, diffusion, and thermal treatment. Integrated circuits and wirings configuring a semiconductor device may be formed by performing the subsequent semiconductor process. Also, the subsequent semiconductor process may perform a packaging process of mounting the semiconductor device on a printed circuit board and forming a molding layer. Also, the subsequent semiconductor process may include a test process of testing the semiconductor device or a semiconductor package. The semiconductor device or the semiconductor package may be finished by performing the subsequent semiconductor process. It should be noted that the term "semiconductor device" as used herein, may refer to a semiconductor chip or chip stack, a semiconductor package including a semiconductor chip or chip stack, a package substrate, and a molding layer, or a package-on-package device.

According to embodiments, a resonant frequency of a bonded structure where the first substrate S1 is at least partially bonded to the second substrate S2 may be detected when bonding between the first substrate S1 and the second substrate S2 is being performed, and thus, a bonding propagation distance may be very precisely detected. Moreover, according to embodiments, a substrate bonding process may be controlled by using the detected resonant frequency, and thus, a precision of substrate bonding may be enhanced, thereby manufacturing a semiconductor device at a very high precision.

While the inventive concept has been particularly shown and described with reference to embodiments thereof, it will be understood that various changes in form and details may be made therein without departing from the spirit and scope of the following claims.

What is claimed is:

1. A substrate bonding apparatus for bonding a first substrate to a second substrate, the substrate bonding apparatus comprising:
   a first bonding chuck configured to support the first substrate;
   a second bonding chuck disposed above the first bonding chuck to support the second substrate; and
   a resonant frequency detector configured to detect a resonant frequency of a bonded structure, the bonded structure including the first substrate and the second substrate which are at least partially bonded to each other.

2. The substrate bonding apparatus of claim 1,
   wherein the resonant frequency detector is configured to:
   detect a vibration of the bonded structure; and
   detect a resonant frequency of the bonded structure on the basis of the detected vibration of the bonded structure.

3. The substrate bonding apparatus of claim 2, further comprising a controller configured to control a distance between the first bonding chuck and the second bonding chuck according to the detected resonant frequency of the bonded structure,
   wherein the controller is configured to:
   detect, on the basis of the detected resonant frequency of the bonded structure, a bonding propagation distance corresponding to a diameter of a bonded region in which a portion of the first substrate is bonded to a portion of the second substrate, and
   control the distance of the first bonding chuck and the second bonding chuck on the basis of the detected bonding propagation distance.

4. The substrate bonding apparatus of claim 1, further comprising:
   a vibrator configured to apply a vibration to the bonded structure.

5. The substrate bonding apparatus of claim 1,
   wherein the second bonding chuck comprises a pressurization pin configured to pressurize a center portion of the second substrate toward the first substrate.

6. The substrate bonding apparatus of claim 5,
   wherein the pressurization pin is configured to apply a vibration to the bonded structure.

7. The substrate bonding apparatus of claim 6,
   wherein the resonant frequency detector comprises a vibration sensor provided in the pressurization pin to sense a vibration of the pressurization pin.

8. The substrate bonding apparatus of claim 1,
   wherein the first bonding chuck comprises a first pressurization pin configured to pressurize a center portion of the first substrate toward the second substrate, and
   wherein the second bonding chuck comprises a second pressurization pin configured to pressurize a center portion of the second substrate toward the first substrate.

9. The substrate bonding apparatus of claim 8,
   wherein the first pressurization pin is configured to apply a vibration to the bonded structure, and
   wherein the resonant frequency detector comprises a vibration sensor provided in the second pressurization pin to sense a vibration of the second pressurization pin.

10. The substrate bonding apparatus of claim 1,
    wherein the resonant frequency detector comprises a vibration sensor provided in the first bonding chuck or the second bonding chuck to sense a vibration of the bonded structure.

11. The substrate bonding apparatus of claim 1,
    wherein the resonant frequency detector comprises a laser Doppler vibrometer configured to measure a vibration of a surface of the first substrate or a vibration of a surface of the second substrate.

12. The substrate bonding apparatus of claim 1,
    wherein the resonant frequency detector comprises a gap sensor configured to measure a displacement of a surface of the first substrate or a displacement of a surface of the second substrate.

13. The substrate bonding apparatus of claim 1,
    wherein the resonant frequency detector comprises a sound wave sensor configured to irradiate a sound wave onto the bonded structure and measure a sound wave reflected from the bonded structure.

14. The substrate bonding apparatus of claim 1,
    wherein the first bonding chuck comprises a first deformable plate configured to deform the first substrate during a time when supporting the first substrate, and
    wherein the resonant frequency detector comprises a vibration sensor provided on the first deformable plate.

15. A substrate bonding apparatus for bonding a first substrate to a second substrate, the substrate bonding apparatus comprising:
    a first bonding chuck configured to support the first substrate;
    a second bonding chuck disposed above the first bonding chuck to support the second substrate;
    a vibration sensor configured to detect a vibration of a bonded structure, the bonded structure comprising the first substrate and the second substrate, which are at least partially bonded to each other;
    an analyzer configured to detect a resonant frequency of the bonded structure on the basis of a vibration signal transmitted from the vibration sensor; and
    a controller configured to detect a bonding propagation distance corresponding to a diameter of a bonding region of the bonded structure on the basis of the detected resonant frequency of the bonded structure.

16. The substrate bonding apparatus of claim 15,
wherein the controller is configured to control a distance between the first bonding chuck and the second bonding chuck on the basis of the bonding propagation distance.

17. The substrate bonding apparatus of claim 16,
wherein, the controller, in responding to the bonding propagation distance reaching a target distance, is configured to cause the second bonding chuck to move toward the first bonding chuck to reduce the distance,
wherein each of the first and second substrates has a diameter of about 300 mm, and
wherein the target distance is within a range of about 150 mm to about 260 mm.

18. The substrate bonding apparatus of claim 15,
wherein the second bonding chuck is disposed above the first bonding chuck,
the first bonding chuck comprises a first pressurization pin configured to upward pressurize a center of the first substrate toward the second substrate to vary a displacement of the center of the first substrate, and
the second bonding chuck comprises a second pressurization pin configured to downward pressurize a center of the second substrate toward the first substrate to vary a displacement of the center of the second substrate.

19. The substrate bonding apparatus of claim 18,
wherein the controller is configured to control a distance between the first bonding chuck and the second bonding chuck on the basis of the bonding propagation distance.

20. A substrate bonding apparatus for bonding a first substrate to a second substrate, the substrate bonding apparatus comprising:
a first bonding chuck configured to support the first substrate, the first bonding chuck comprising a first deformable plate configured to deform the first substrate during a time when supporting the first substrate;
a second bonding chuck disposed above the first bonding chuck to support the second substrate;
a vibration sensor provided on the first deformable plate, the vibration sensor being configured to detect a vibration of a bonded structure, the bonded structure including the first substrate and the second substrate that are at least partially bonded to each other;
an analyzer configured to detect a variation of a resonant frequency of the bonded structure; and
a controller configured to detect a bonding propagation distance of the bonded structure on the basis of the detected resonant frequency of the bonded structure.

* * * * *